(12) United States Patent
Tanaka et al.

(10) Patent No.: US 7,868,315 B2
(45) Date of Patent: Jan. 11, 2011

(54) SEMICONDUCTOR MEMORY DEVICE AND METHOD OF MANUFACTURING THE SAME

(75) Inventors: Hiroyasu Tanaka, Tokyo (JP); Mitsuru Sato, Kanagawa-ken (JP); Ryota Katsumata, Kanagawa-ken (JP); Masaru Kidoh, Tokyo (JP); Masaru Kito, Kanagawa-ken (JP); Hideaki Aochi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 297 days.

(21) Appl. No.: 12/037,402

(22) Filed: Feb. 26, 2008

(65) Prior Publication Data

US 2008/0203378 A1    Aug. 28, 2008

(30) Foreign Application Priority Data

Feb. 27, 2007    (JP) .............................. 2007-047486

(51) Int. Cl.
*H01L 29/06* (2006.01)
(52) U.S. Cl. ..................... 257/5; 257/4; 257/E45.002
(58) Field of Classification Search .......... 257/E45.002, 257/2, 3, 4, 5; 365/51
See application file for complete search history.

(56) References Cited

U.S. PATENT DOCUMENTS

| 3,886,577 A | 5/1975 | Buckley |
| 2003/0185086 A1* | 10/2003 | Hoya et al. ............. 365/230.03 |
| 2004/0174732 A1* | 9/2004 | Morimoto ................... 365/148 |

OTHER PUBLICATIONS

U.S. Appl. No. 12/408,249, filed Mar. 20, 2009, Tanaka, et al.
U.S. Appl. No. 12/504,959, filed Jul. 17, 2009, Tanaka, et al.
U.S. Appl. No. 12/562,402, filed Sep. 18, 2009, Tanaka, et al.

* cited by examiner

*Primary Examiner*—Jerome Jackson, Jr.
*Assistant Examiner*—Paul A Budd
(74) *Attorney, Agent, or Firm*—Oblon, Spivak, McClelland, Maier & Neustadt, L.L.P.

(57) ABSTRACT

A phase change memory device including plural memory cells is disclosed. Each of the memory cells includes memory transistors and phase change film portions formed above or below the memory transistors. The phase change film portions correspond to the respective memory transistors respectively. Vias are provided in order to connect each of the memory transistor in parallel to each of the phase change film portions in each of the memory cells. The vias connect the memory cells in series to one another.

13 Claims, 30 Drawing Sheets

"Read"

"Set"

"Reset"

| | WORD LINE | SELECTION TRANSISTOR | SOURCE LINE | BIT LINE |
|---|---|---|---|---|
| Read | WLA2 : off OTHERS : on | SG22 : on OTHERS : off | SL1、SL11:0V | BL3 : Vread OTHERS : 0V |
| Set (Write) | WLA2 : off OTHERS : on | SG22 : on OTHERS : off | SL1、SL11:0V | BL3 : Vset OTHERS : 0V |
| Reset (Cancel) | WLA2 : off OTHERS : on | SG22 : on OTHERS : off | SL1、SL11:0V | BL3 : Vreset OTHERS : 0V |

SEMICONDUCTOR MEMORY DEVICE AND METHOD OF MANUFACTURING THE SAME

CROSS REFERENCE TO RELATED APPLICATION

This application is based upon and claims the benefit of priority from the prior Japanese Patent Application No. 2007-47486, filed on Feb. 27, 2007, the entire contents of which are incorporated herein by reference.

FIELD OF THE INVENTION

The present invention relates to a semiconductor memory device including a plurality of memory cells and to a method of manufacturing the semiconductor memory device.

DESCRIPTION OF THE BACKGROUND

FeRAM (Ferroelectric Random Access Memory), MRAM (Magnetic Random Access Memory), PRAM (Phase Change Random Access Memory), and ReRAM (Resistive Random Access Memory) have been developed as next-generation semiconductor memory devices.

A PRAM is disclosed in Japanese Patent Application Publication No. 2004-158854, for example. The patent publication discloses PRAM including a plurality of memory cells. Each of the memory cells is provided with a phase change element and a memory transistor.

A highly integrated PRAM called as "Chain PRAM" has been developed. The Chain PRAM includes a plurality of memory cells. Each of the memory cells is provided with a phase change element and a memory transistor. The phase change element is connected in parallel to the memory transistor. The memory cells are connected in series to one another (connected in cascade).

In fabrication of the Chain PRAM, memory transistors, phase change elements, and other parts are formed independently. This requires a larger number of manufacturing steps. A similar problem also arises in the case of ReRAM.

SUMMARY OF THE INVENTION

An aspect of the present invention provides a semiconductor memory device, which comprises a semiconductor substrate, a memory cell array including a plurality of memory cells, the memory cells including a plurality of memory transistors and an alternative of phase change film portions and resistance change film portions, the phase change film portions and resistance change film portions being formed above the memory transistors to correspond to the memory transistors respectively, and each of the memory transistors including a gate insulation film formed on the semiconductor substrate, a gate electrode formed on the gate insulation film, a source region and a drain region formed apart from the source region in the semiconductor substrate, and a plurality of first vias, each of the first via being formed between two adjacent ones of the memory transistors and between two adjacent ones of the alternative of the phase change film portions and the resistance change film portions in order to connect the memory transistors to each other electrically and in order to connect the alternative of the phase change film portions and the resistance change film portions to each other electrically, and each of the first vias being electrically connected to the source region of one of the two adjacent memory transistors and to the drain region of the other of the two adjacent memory transistors, wherein the memory transistors are connected in parallel respectively to the alternative of the phase change film portions and the resistance change film portions with the first vias, and the memory cells are connected in series to one another with the first vias.

Another aspect of the present invention provides a semiconductor memory device, which comprises a semiconductor substrate, an alternative of phase change film portions and a resistance change film portions formed above the semiconductor substrate, a semiconductor film formed above the alternative of phase change film portions and a resistance change film portions, memory transistors each of which includes a source region, a drain region, a gate insulation film, and a gate electrode, the source region and the drain region being formed in the semiconductor film so as to be apart from each other, the gate insulation film being formed on the semiconductor film, the gate electrode being formed on the gate insulation film, and the memory transistors being formed so as to correspond to the respective ones of the alternative of phase change film portions and a resistance change film portions; and a plurality of first vias, each of the first vias being formed between two adjacent ones of the memory transistors and between two adjacent ones of the alternative of phase change film portions and a resistance change film portions in order to connect the memory transistors to each other electrically and in order to connect the alternative of the phase change film portions and the resistance change film portions to each other electrically; wherein the memory transistors are connected in parallel respectively to the alternative of the phase change film portions and the resistance change film portions with the first vias, and the memory cells are connected in series to one another with the first vias.

Still another aspect of the present invention provides a method of manufacturing a semiconductor memory device, which comprises forming a gate insulation film on a semiconductor substrate, forming a plurality of gate electrodes on the gate insulation film so as to be apart from one another, each of the gate electrodes forming a part of a memory transistor, forming a plurality of impurity diffusion layers in the semiconductor substrate so as to e apart from one another, the impurity diffusion layers being source regions and drain regions, forming an insulation film on each of the gate electrodes and between the gate electrodes, forming an alternative of the phase change film portions and the resistance change film portions on the insulation film portions formed above the memory transistors to correspond to the respective memory transistors, forming a plurality of contact opening portions on the impurity diffusion layer by etching parts of the insulation film between the gate electrodes, forming a plurality of first vias in the respective contact opening portions, and connecting each of the first vias to two adjacent ones of the impurity diffusion layers and to two adjacent ones of the alternative of the phase change film portions and the resistance change film portions.

BRIEF DESCRIPTION OF THE DRAWINGS

FIGS. 7A to 18A are plan views showing manufacturing steps of the phase change memory device of the first embodiment.

FIGS. 7B to 18B are sectional views corresponding respectively to FIGS. 7A to 18A.

FIGS. 23A to 32A are plan views showing manufacturing steps of the phase change memory device of the third embodiment.

FIGS. 23B to 32B are sectional views corresponding respectively to FIGS. 23A to 32A.

DETAILED DESCRIPTION OF THE INVENTION

Embodiments of the present invention will be described hereinafter with reference to the drawings.

Figure 1:
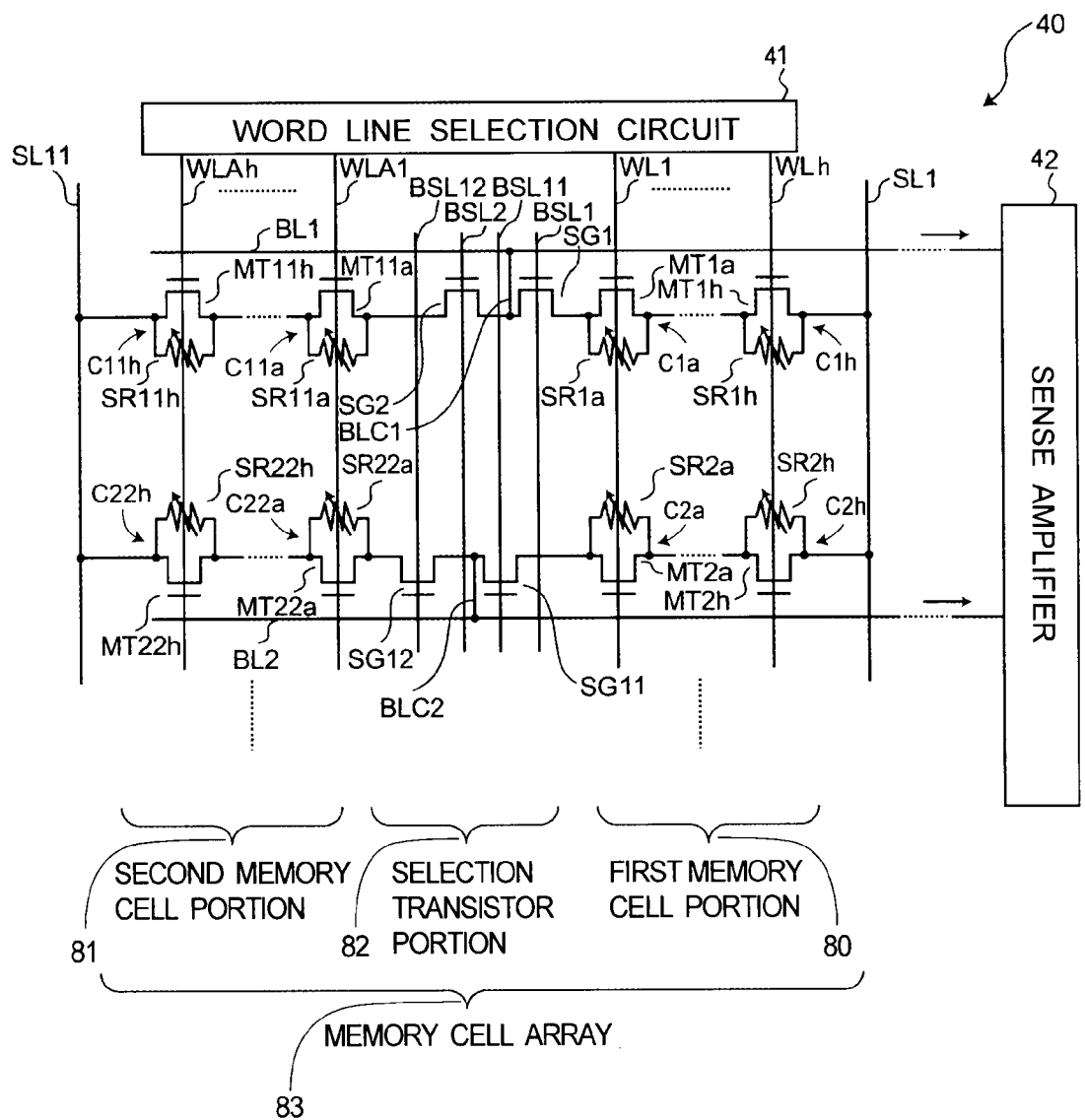
FIG. 1 is a circuit diagram showing a phase change memory device according to a first embodiment of the present invention.
Figure 2:
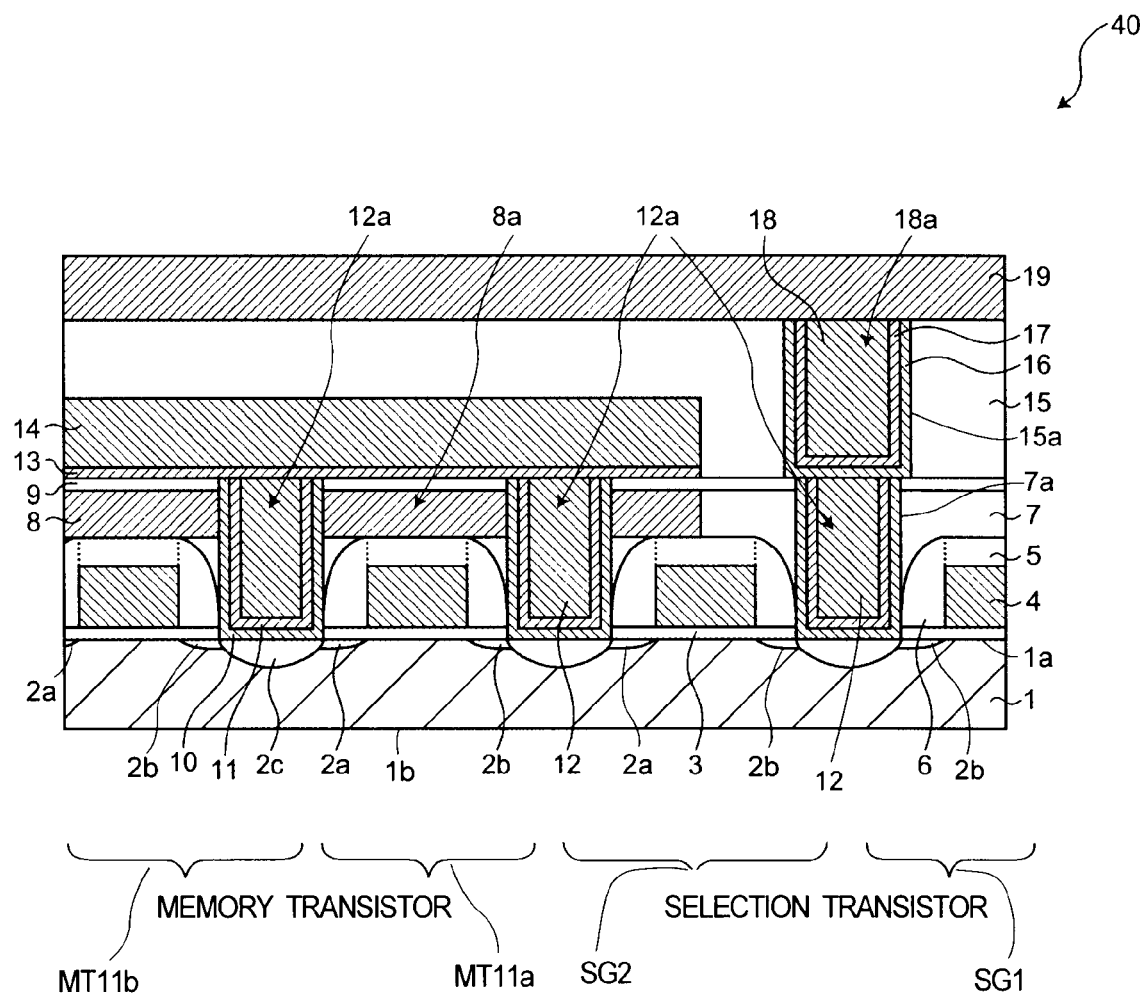
FIG. 2 is a sectional view showing a principal part of a memory cell array of the phase change memory device of FIG. 1.

A phase change memory device according to a first embodiment will be described with reference to FIGS. 1 and 2. FIG. 1 is a circuit diagram showing the phase change memory device. FIG. 2 is a sectional view showing a principle part of a memory cell array of the phase change memory device.

As shown in FIG. 1, a phase change memory device 40 as a semiconductor memory device includes a memory cell array 83. The memory cell array 83 includes memory cells C1a, . . . , C1h; C2a, . . . , C2h; C11a, . . . , C11h; and C22a, . . . , C22h. The memory cells form a first memory cell portion 80 and a second memory cell portion 81. Word lines WL1, . . . , WLh; and WLA1, . . . , WLAh as well as bit lines BL1, BL2, . . . are connected to the memory cells. The word lines are connected to a word line selection circuit 41. Selection transistors SG1, SG2, SG11, and SG12 are connected between the memory cells and the bit lines BL1, BL2, . . . to select the bit lines.

The bit lines BL1, BL2, . . . are connected to a sense amplifier 42. A data input/output unit (not illustrated) is connected to the sense amplifier 42 to enable input and output of data. The selection transistors SG1, SG2, SG11, and SG12 form a selection transistor portion 82.

The memory cells C1a, . . . , C1h; C2a, . . . , C2h; C11a, . . . , C11h; and C22a, . . . , C22h are arranged in parallel to the bit lines BL1, B12, . . . .

Each of the memory cells includes one of memory transistors MT1a, MT1h; MT2a, . . . , MT2h; MT11a, . . . , MT11h; and MT22a, . . . , MT22h, as well as a corresponding one of phase change elements SR1a, . . . , SR1h; SR2a, . . . , SR2h; SR11a, . . . , SR11h; and SR22a, . . . , SR22h. The phase change elements are plural portions of a phase change film while the plural portions correspond to the memory transistors respectively. The memory transistors MT1h and MT2h, which are located at the most right-hand side in FIG. 1 among the memory transistors, are connected to a source line SL1. On the other hand, the memory transistors MT11h and MT22h, which are located at the most left-hand side in FIG. 1 among the memory transistors, are connected to a source line SL11.

In each memory cell, one of the memory transistors is connected in parallel to the corresponding one of the phase change elements. Every number "h" of the memory cells is connected in series to one another (or in cascade connection) so as to be in parallel to the bit lines BL1 and BL2.

Here, "h" is an integer that is not smaller than two while the maximum value of "h" is determined in accordance with the electric properties required for the Chain PRAM.

The phase change memory device 40 is a Chain PRAM (Phase Change Random Access Memory).

Specifically, the source region of each of the memory transistors MT1a, . . . , MT1h; MT2a, . . . , MT2h; MT11a, . . . , MT11h; and MT22a, . . . , MT22h is connected to a first end of each of the phase change elements SR1a, . . . , SR1h; SR2a, . . . , SR2h; SR11a, . . . , SR11h; and SR22a, . . . , SR22h, while the drain region of the memory transistor is connected to a second end of the phase change element. The gate of the memory transistor is connected to the corresponding one of the word lines.

The selection transistor portion 82 is formed between the first memory cell portion 80 and the second memory cell portion 81. The selection transistors SG1 and SG2 are connected in series to each other so as to be in parallel to the bit line BL1. The selection transistors SG11 and SG12 are connected in series to each other so as to be in parallel to the bit line BL2.

The gate of the selection transistor SG1 is connected to a selection line BSL1. The gate of the selection transistor SG2 is connected to a selection line BSL2. The gate of the selection transistor SG11 is connected to a selection line BSL11. The gate of the selection transistor SG12 is connected to a selection line BSL12.

The source region of the selection transistor SG1 is connected to the memory transistor MT1a and the phase change element SR1a. The source region of the selection transistor SG2 is connected to the memory transistor MT11a and the phase change element SR11a. The source region of the selection transistor SG11 is connected to the memory transistor MT2a and the phase change element SR2a. The source region of the selection transistor SG12 is connected to the memory transistor MT22a and the phase change element SR22a.

The drain region of the selection transistor SG1 and the drain region of the selection transistor SG2 are connected to the bit line BL1 via a bit line connection line BLC1. The drain region of the selection transistor SG11 and the drain region of the selection transistor SG12 are connected to the bit line BL2 via a bit line connection line BLC2.

The word line selection circuit 41 outputs word line control signals to the gate of each memory transistor of the first and the second memory cell portions 80 and 81 via the word lines WL1, . . . , WLh, and WLA1, . . . , WLAh. The On/OFF action of each memory transistor of the first and the second memory cell portions 80 and 81 is performed on the basis of the word line control signal and thus selection of the phase change element is performed. Accordingly made possible are the writing and the reading of data in the following way.

Data is inputted into the sense amplifier 42 from the data input/output unit (not illustrated), and then the data is written in the selected memory cell via the corresponding ones of the bit lines BL1, BL2, . . . , the bit line connection lines BLC1, BLC2, . . . , and the selection transistors SG1, SG2, SG11, and SG12. The data stored in the selected memory cell is read out to the sense amplifier 42 via the corresponding ones of the selection transistors SG1, SG2, SG11, and SG12, the bit line connection lines BLC1, BLC2, . . . , and the bit lines BL1, BL2, . . . , and is then amplified. The data amplified in the sense amplifier 42 is outputted from the data input/output unit (not illustrated).

The principal part of the phase change memory device 40 has such a structure as shown in FIG. 2.

A semiconductor substrate 1 has a first principal surface 1*a* and a second principal surface 1*b*. In a surface region on the first principle surface 1*a* of the semiconductor substrate 1, source regions 2*a* and drain regions 2*b*, which are high-concentration diffusion layers having an opposite conductive type to that of the semiconductor substrate 1.

Here, the source regions 2*a* and the drain regions 2*b* function respectively as the source regions and the drain regions of the memory transistors MT11*a* and MT11*b* as well as of the selection transistors SG1 and SG2. High-concentration diffusion layers 2*c* are formed deep into the semiconductor device, and actually are deeper than the source regions 2*a* and the drain regions 2*b*. The high-concentration diffusion layers 2*c* function as contact diffusion layers of the memory transistors MT11*a* and MT11*b* as well as of the selection transistors SG1 and SG2.

A gate insulation film 3 is formed on the semiconductor substrate 1. Gate electrode films 4 are formed on the gate insulation film 3. Insulation films 5 are formed on the respective gate electrode films 4. Insulation films 6 is formed as side wall films so that each insulation film 6 can cover a part of the gate insulation film 3, the corresponding side surfaces of the gate electrode films 4 and of the insulation films 5.

Insulation films 7 are formed as interlayer insulation films and are formed on the corresponding insulation films 5 and 6. A phase change film 8 is formed on a surface formed by the insulation films 5, 6, and 7. Plural portions 8*a* are included in the phase change film 8 and correspond to the respective memory transistors. These portions 8*a* may be separated from each other thoroughly or connected partly to each other.

Insulation films 9 are formed as inter layer insulation films so as to cover the top of the phase change film 8 and the top of the above-mentioned thicker parts of the insulation films 7.

First contact opening portions 7*a* are formed on the high-concentration diffusion layers 2*c* serving as contact diffusion layers. Layers of a metal film 10, of a metal nitride film 11 and of a via electrode 12 are formed and are buried in each first contact opening portion 7*a*. The metal film 10, the metal nitride film 11, and the via electrode 12 form a via 12*a*.

The source region 2*a* and the drain region 2*b* of each of the memory transistors MT11*a* and MT11*b* are electrically connected, with the vias 12*a*, to the portion 8*a* of the phase change film 8 located above the corresponding one of the memory transistors MT11*a* and MT11*b*. Those electrically connected components form a memory cell.

A reaction prevention film 13 and a heat buffer film 14 are formed above some part of the memory transistors MT11*a* and MT 11*b* as well as on some part of the insulating films 9 and the vias 12*a*.

An insulation film 15 is formed as an interlayer insulation film so as to cover the side portions of the reaction prevention film 13, the top portion of the heat buffer film 14 and some of the top portion of the insulation film 9. Over the via 12*a* between the selection transistors SG1 and SG2, a second contact opening portion 15*a* is formed. The second contact opening portion 15*a* is formed by partially etching the insulation film 15.

A metal film 16, a metal nitride film 17 and a via electrode 18 are buried in the second contact opening portion 15*a*. The metal film 16, the metal nitride film 17, and the via electrode 18 form a via 18*a*. On the via 18*a* and the insulation film 15, a wiring layer 19 is formed as wirings of bit lines. The wiring layer 19 is electrically connected to the via 18*a*.

The memory transistors and the selection transistors are arranged so as to be located respectively on the left and the right sides of the second contact opening portion 15*a* in the drawing (that is, are arranged mirror-symmetrically with the center of the second contact opening portion 15*a* being the center line of the symmetry). The gate electrode film 4 of each memory transistor is connected to the corresponding one of the word line wiring with the unillustrated via electrode and the like.

As the phase change film 8, a GST (GeSbTe chalcogenide) film is used, for example. The reaction prevention film 13 is provided to prevent the via 12*a* and the heat buffer film 14 from reacting during the process of the heat treatment in the manufacturing of the phase change memory device 40 and to prevent the constituent substances of the phase change film 8 from being diffused.

As the reaction prevention film 13, a silicon nitride (SiN) film is used, for example. The heat buffer film 14 is a film provided to absorb the heat produced from the phase change film 8 when the memory cells operate. For this reason, the heat buffer film 14 is also called a heat sink film.

Electric charges may be transferred between the heat buffer film 14 and the via electrode 12, which are provided with the reaction prevention film 13 interposed in between, and an example of such a transfer occurs by use of the tunnel current of the reaction prevention film 13. Such a transfer, however, is not always necessary.

In the phase change memory device 40 as a whole, the source regions 2*a* and the drain regions 2*b* of the memory transistors MT1*a*, . . . , MT1*h*, MT2*a*, . . . , MT2*h*, MT11*a*, . . . , MT11*h*, and MT22*a*, . . . , MT22*h*, as well as the portions 8*a* of the phase change film 8 are electrically connected to the corresponding ones of the vias 12*a* buried in the respective first contact opening portions 7*a*.

The source regions and the drain regions of the selection transistors SG1, SG2, SG11, and SG12 are electrically connected to the corresponding via electrodes 12 buried in the respective first contact opening portions 7*a*.

The gate electrode films 4, the portions 8*a* of phase change film 8 located above the gate electrode films 4, the heat buffer film 14 located above the phase change film 8 are formed in parallel to the first principal surface 1*a* of the semiconductor substrate 1. In addition, the gate electrode films 4 are formed so as to make the difference in level among the gate electrode films 4 smaller. The portions 8*a* of the phase change film 8 are formed likewise. So is the heat buffer film 14.

In the embodiment, the vias 12*a* to connect the memory transistors MT1*a*, . . . , MT1*h*, MT2*a*, . . . , MT2*h*, MT11*a*, . . . , MT11*h*, and MT22*a*, MT22*h* with one another and to connect each of the memory transistors in parallel to the corresponding portions 8*a* of the phase change film 8 can be formed simultaneously with the vias 12*a* to connect the selection transistors SG1, SG2, SG11, and SG12. Accordingly, the phase change memory device 40 can be manufactured with a significantly smaller number of manufacturing processes.

In addition, the phase change film 8 is formed in a flat surface while the surfaces of the vias 12a and the surface of the insulation film 9 are formed in a flat surface. In addition, the surface of the insulation film 15 is also formed in a flat surface. Accordingly, when the phase change memory device 40 is manufactured, the breaking of wiring becomes less likely to happen in the wiring layer 19 and in the wiring layers provided above the wiring layer 19. As a consequence, each of the wiring layers can be formed in a narrower width with ease while the multiple layer wiring can be achieved with ease.

Figure 3:
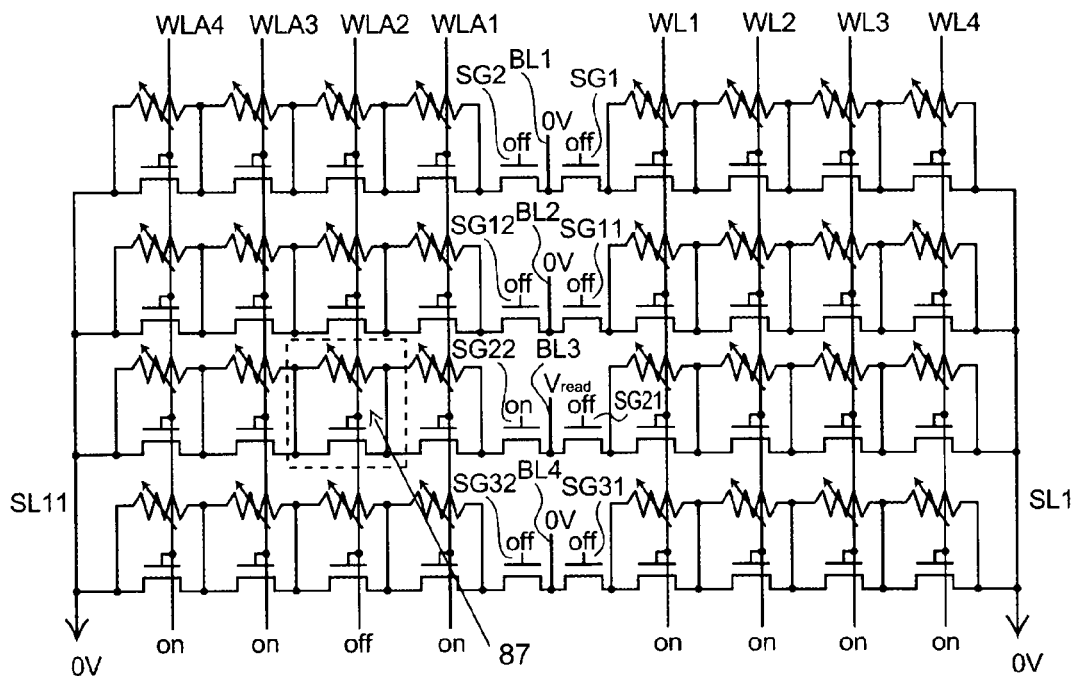
FIG. 3 is an equivalent circuit diagram to describe a reading operation of the phase change memory device of the first embodiment.
Figure 4:
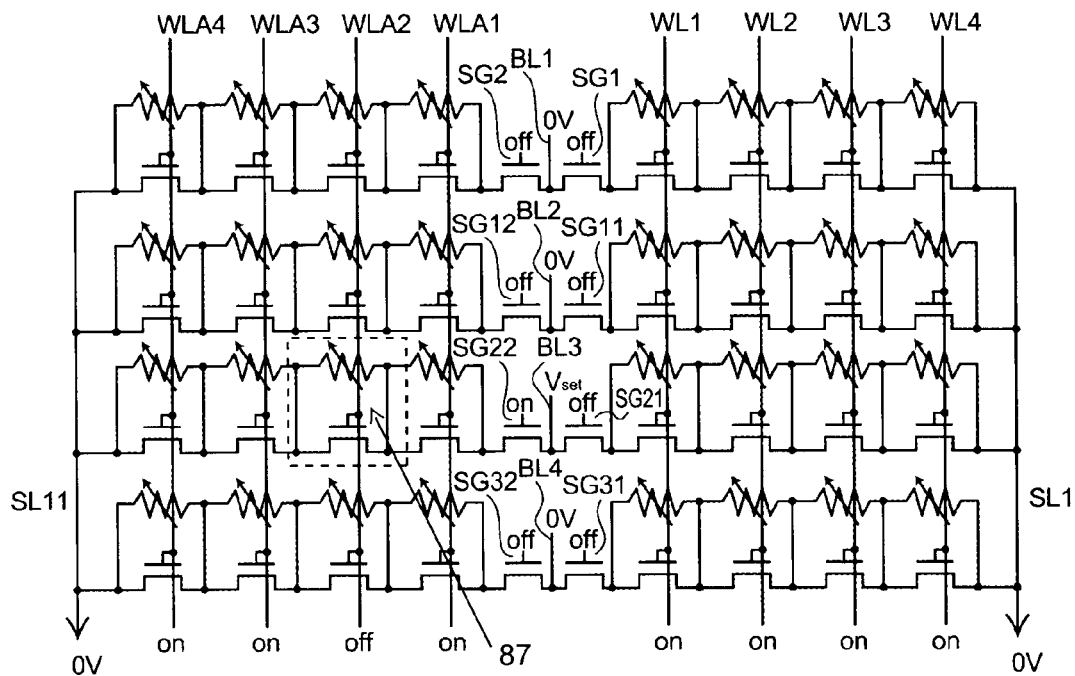
FIG. 4 is an equivalent circuit diagram to describe a writing operation of the phase change memory device of the first embodiment.
Figures 5, 6:
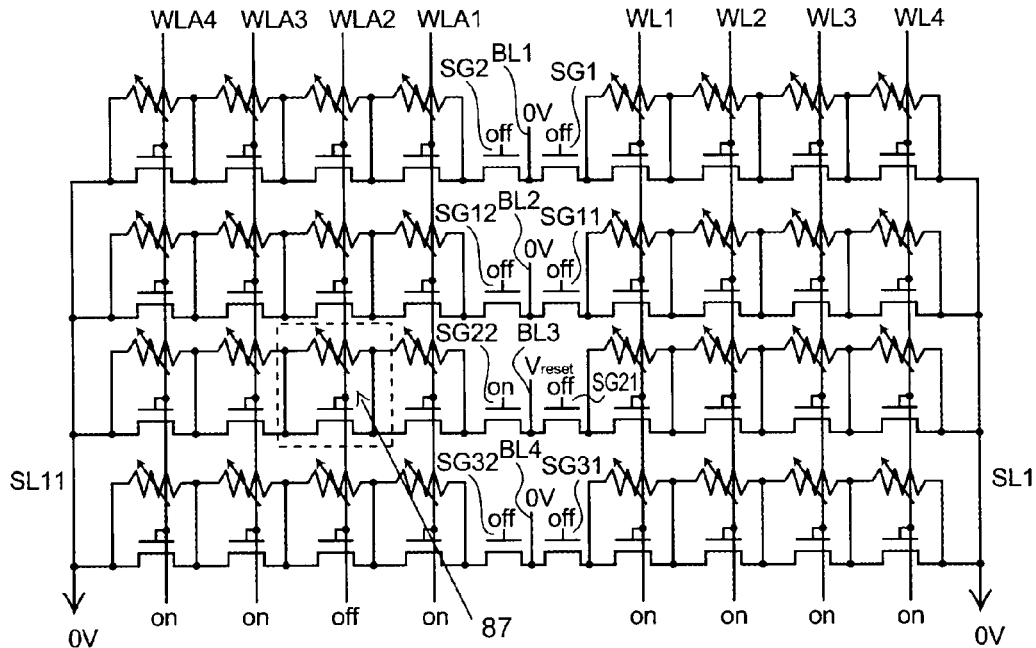
FIG. 5 is an equivalent circuit diagram to describe a canceling operation of the phase change memory device of the first embodiment.
FIG. 6 is an equivalent circuit diagram to describe operations of the phase change memory device of the first embodiment.

Subsequently, the operations of the phase change memory device 40 will be described with reference to FIGS. 3 to 6. FIG. 3 is an equivalent circuit diagram for describing a reading operation of the phase change memory, FIG. 4 is an equivalent circuit diagram for describing a writing operation of the phase change memory, FIG. 5 is an equivalent circuit diagram for describing a cancelling operation of the phase change memory, and FIG. 6 is an equivalent circuit diagram for describing operations of the phase change memory. Here, the number h of the memory cells that are connected in series to one another is 4.

As shown in FIG. 3, the selection transistor SG1 and four memory cells connected in series to one another are provided between the bit line BL1 and the source line SL1, for example. The selection transistor SG2 and four memory cells connected in series to one another are provided between the bit line BL1 and the source line SL11. The word lines WL1, . . . , WL4 are connected to the respective gates of the memory transistors, which form the respective memory cells. Similar connections are formed between other selection transistors and the corresponding bit lines as well as between the memory cells and the corresponding word lines.

Now assume that a memory cell is selected by the bit line BL3, the word line WLA2, and the source line SL11, and that the memory cell thus selected is named a selection memory cell 87. Then, a case where data is read from the selection memory cell 87 will be described.

As shown in FIG. 6, the word line WLA2 connected to the selection memory cell 87 from which data will be read is set at the off-voltage Voff. Meanwhile, the other word lines are set at the on-voltage Von. The gate of the selection transistor SG22 connected to the bit line BL3 is set at the on-voltage Von. Meanwhile, the gates of the other selection transistors are set at the off-voltage Voff.

The source line SL1 and the source line SL11 are set at the ground voltage, that is, 0 V for example. The bit line BL3 connected to the selection memory cell 87 from which data will be read is set at the reading voltage Vread. Data can be read from the selection memory cell 87 by reading the magnitude of the current flowing through the bit line BL3.

A case, shown in FIG. 4, will be described. In the case, data will be written in a memory cell selected by the bit line BL3, the word line WLA2, and the source line SL11, that is, in the selection memory cell 87.

As shown in FIG. 6, the word line WLA2 connected to the selection memory cell 87 in which data will be written is set at the off-voltage Voff. Meanwhile, the other word lines are set at the on-voltage Von. The gate of the selection transistor SG22 connected to the bit line BL3 is set at the on-voltage Von. Meanwhile, the gates of the other selection transistors are set at the off-voltage Voff. The source line SL1 and the source line SL11 are set at the ground voltage, that is, 0 V for example. The bit line BL3 connected to the selection memory cell 87 in which data will be written is set at a setting voltage Vset. The set voltage Vset causes a relatively small current to flow through the phase change film 8 connected in parallel to the selection memory cell 87 in which data will be written, and thus the phase change film 8 turns into a poly-crystalline state. Accordingly, the phase change film 8 connected in parallel to the selection memory cell 87 becomes low-resistant, that is, turns into a state of "1."

A case shown in FIG. 5 will be described. In the case, data is cancelled from a memory cell selected by the bit line BL3, the word line WLA2, and the source region line SL11, that is, in the selection memory cell 87.

As shown in FIG. 6, the word line WLA2 connected to the selection memory cell 87 from which data will be cancelled is set at the off-voltage Voff. Meanwhile, the other word lines are set at the on-voltage Von. The gate of the selection transistor SG22 connected to the bit line BL3 is set at the on-voltage Von. Meanwhile, the gates of the other selection transistors are set at the off-voltage Voff. The source line SL1 and the source line SL11 are set at the ground voltage, that is, 0 V for example. The bit line BL3 connected to the selection memory cell 87 from which data will be cancelled is set at a resetting voltage Vreset. The reset voltage Vreset causes a relatively large current to flow through the phase change film 8 connected in parallel to the selection memory cell 87 from which data will be cancelled, and thus the phase change film 8 turns into an amorphous state. Accordingly, the phase change film 8 connected in parallel to the selection memory cell 87 becomes high-resistant, that is, turns into a state of "0."

A method of manufacturing the phase change memory device 40 will be described with reference to FIGS. 7A to 18A and FIGS. 7B to 18B. FIGS. 7A to 18A and FIGS. 7B to 18B are diagrams showing manufacturing processes of the phase change memory device 40. FIGS. 7A to 18A are plan views of a principal part of a wafer where the phase change memory device 40 is being formed. FIGS. 7B to 18B are sectional views of the respective FIGS. 7A to 18A taken along the line A-A in FIG. 7A and the like.

Figure 7A:
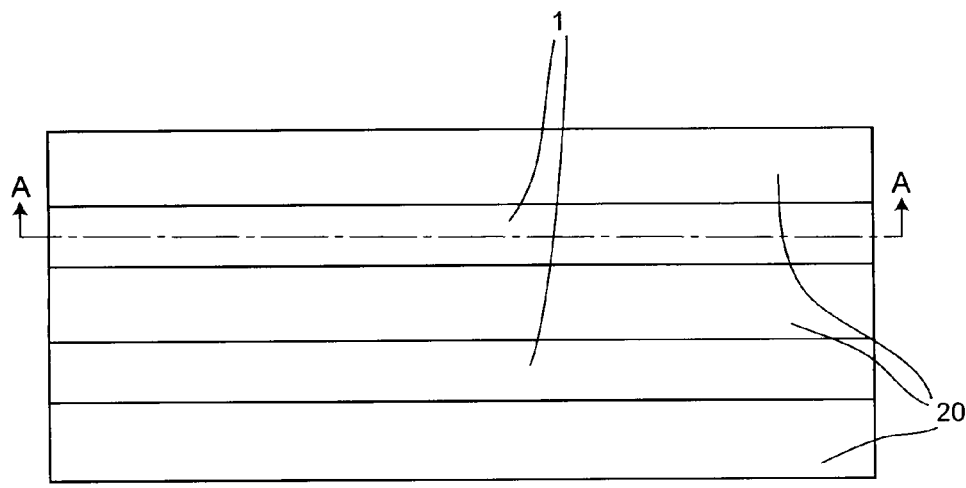
Figure 7B:

A p-type silicon substrate is employed as the semiconductor substrate 1 shown in FIGS. 7A and 7B.

Insulation layers are buried into the semiconductor substrate 1 from the first principle surface side of the semiconductor substrate 1 by the shallow trench isolation (STI) technique. The insulating layers 20 are buried in the regions other than the active regions where transistors and the like are to be formed later. The insulation layers 20 serve to separate the elements such as transistors.

Figure 8A:
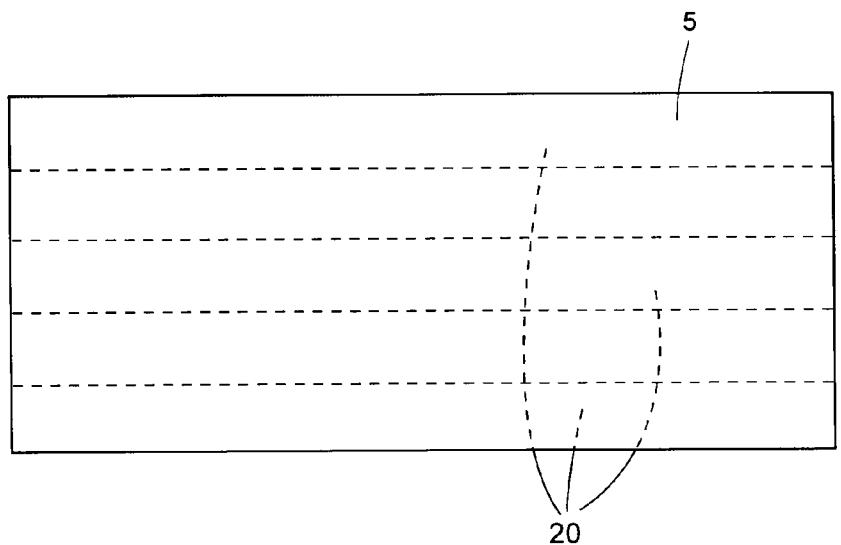
Figure 8B:
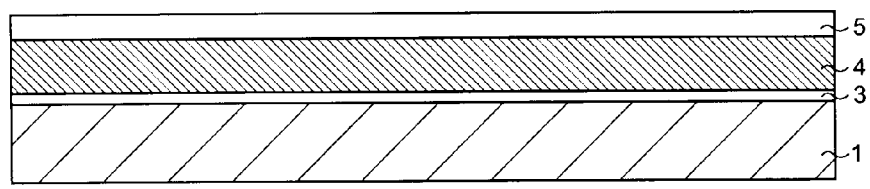

As shown in FIGS. 8A and 8B, on top of the first principal surface of the semiconductor substrate 1, layers of the gate insulation film 3 the gate electrode film 4 and the insulation film 5 are formed in this sequence. Besides a silicon oxide film made by thermally oxidizing a silicon film, a $SiN_xO_y$ film made by thermally nitriding a silicon oxide film, a laminating film of a silicon nitride ($Si_3N_4$) film and silicon oxide film, and a high-dielectric film (High-K insulation film) can be used as the gate insulation film 3.

Besides a high-concentration amorphous silicon film doped densely with impurities, a polycrystalline silicon film of a high concentration of impurities or the like can be used as the gate electrode film 4.

Figure 9A:
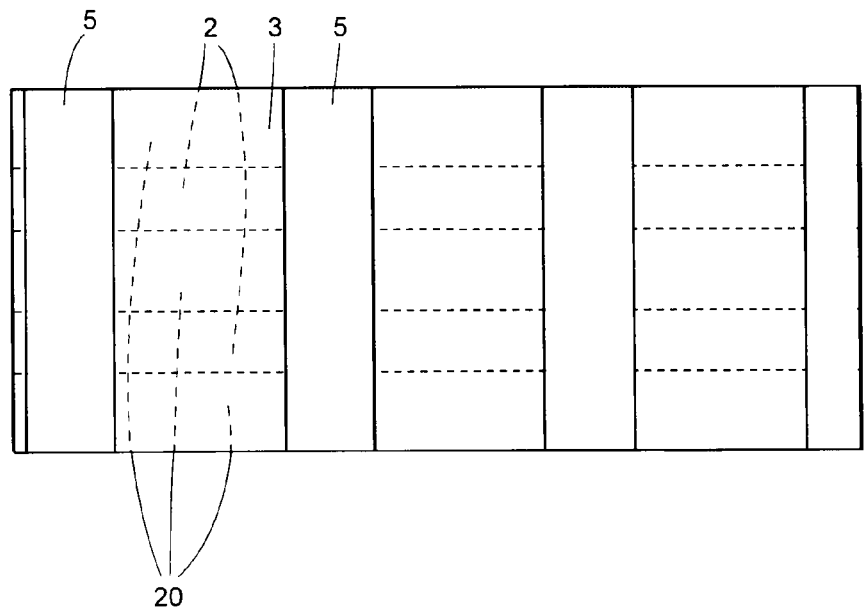
Figure 9B:
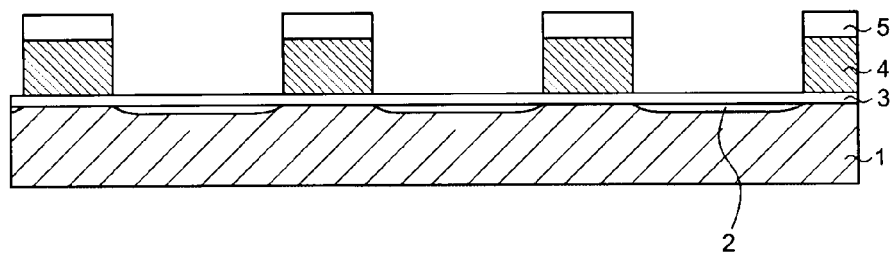

Subsequently, using a mask of an unillustrated resist film made by a known lithography method, the insulation film 5 and the gate electrode film 4 are partially removed by etching in accordance with the reactive ion etching (RIE) method, for example. Though the gate insulation film 3 is left intact in FIG. 9B, a part of the gate insulation film 3 may be removed by etching. After the resist film is removed, n type impurities are implanted into the semiconductor substrate 1 from the first principal surface side of the semiconductor substrate 1 by the ion-implantation method, for example. The layer into which the ions have been implanted is activated by a heat treatment, and thus a high-concentration diffusion layer 2 is formed as shown in FIGS. 9A and 9B.

Figure 10A:
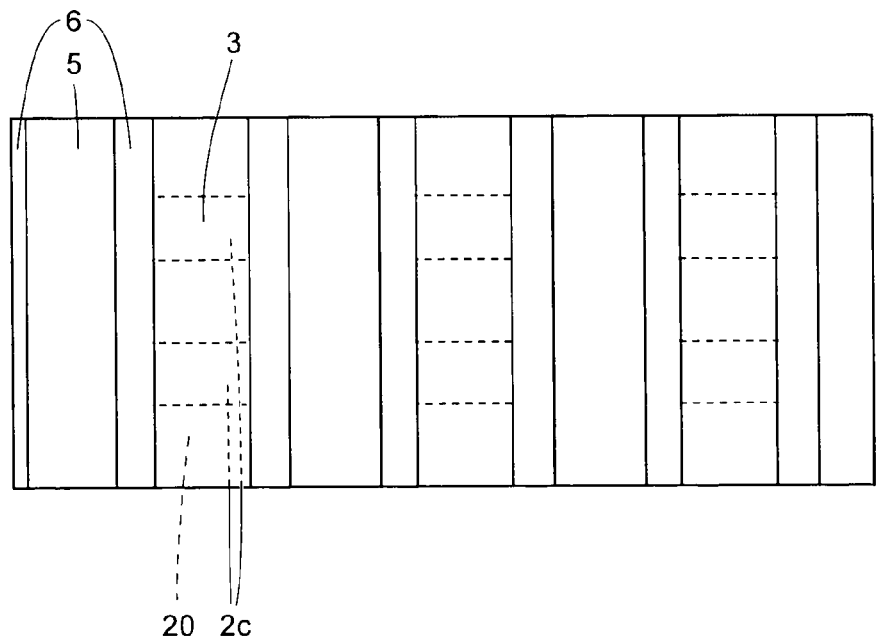
Figure 10B:
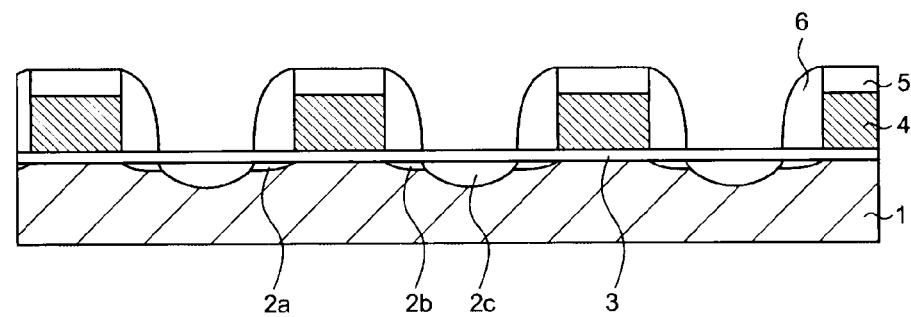

Then, after the deposition of the insulation film 6 on the entire surface, the insulation film 6 is removed by the RIE method, for example, but a part of the insulation film 6 is left in the side wall portions of the gates as shown in FIGS. 10A and 10B. The insulation film 6 may be a silicon nitride film. Ions of the same conductive type (n type) as that of the high-concentration diffusion layer 2 are implanted into the first principal surface of the semiconductor substrate 1 by the ion-implantation method, for example. The layer into which the ions have been implanted is activated by a heat treatment, and thus a high-concentration diffusion layer 2c is formed. The high-concentration diffusion layer 2c is formed more deeply into the semiconductor substrate 1 than the high-concentration diffusion layer 2 is. Consequently, the source regions (high-concentration diffusion layers) 2a and the drain regions (high-concentration diffusion layers) 2b are left as the regions in each of which the high-concentration diffusion layer 2 is formed.

Figure 11A:
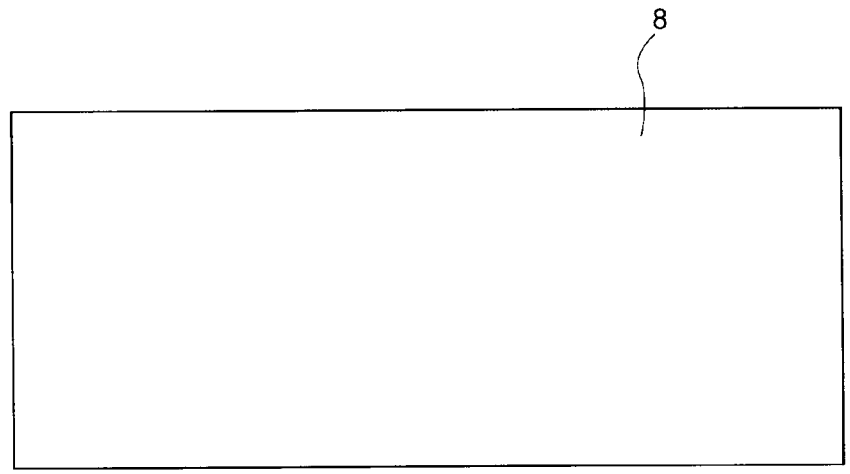
Figure 11B:
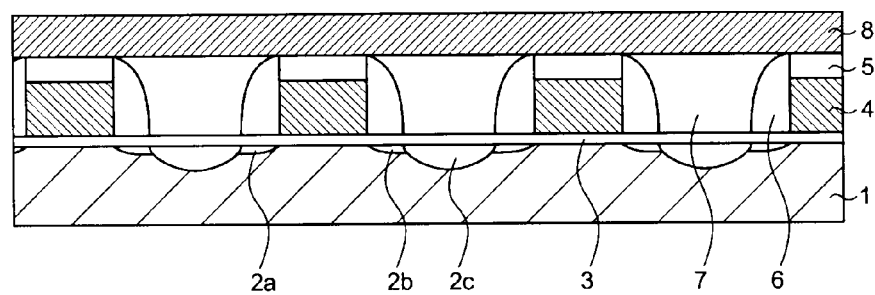

After the deposition of the insulation film 7 as the interlayer insulation film, the insulation film 7 is polished by the chemical mechanical polishing (CMP) method, for example, until the surface of the insulation films 5 is exposed. The phase change film 8 is formed over the tops of the insulation films 5, of the insulation films 6, and of the insulation films 7, as shown in FIGS. 11A and 11B. GST (GeSbTe chalcogenide) can be used for the phase change film 8. Besides, AsSbTe, SeSbTe, or these materials with addition of oxygen (O), nitrogen (N), or silicon (Si) are some examples used for the purpose.

Figure 12A:
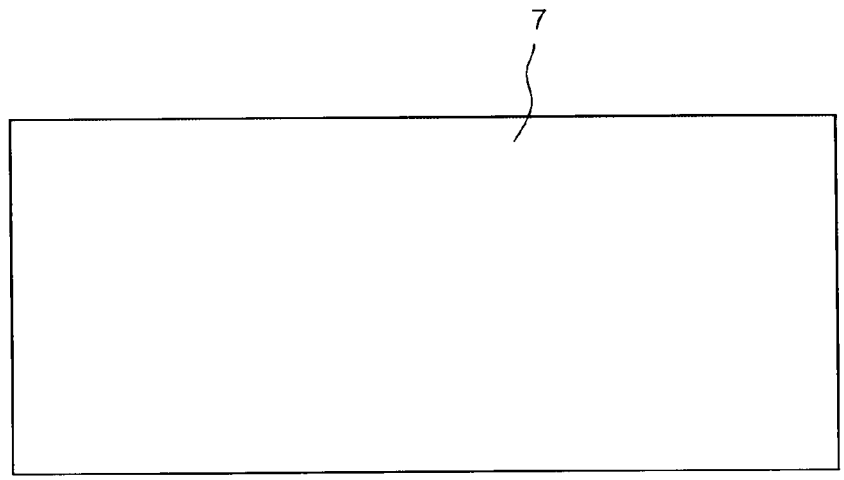
Figure 12B:
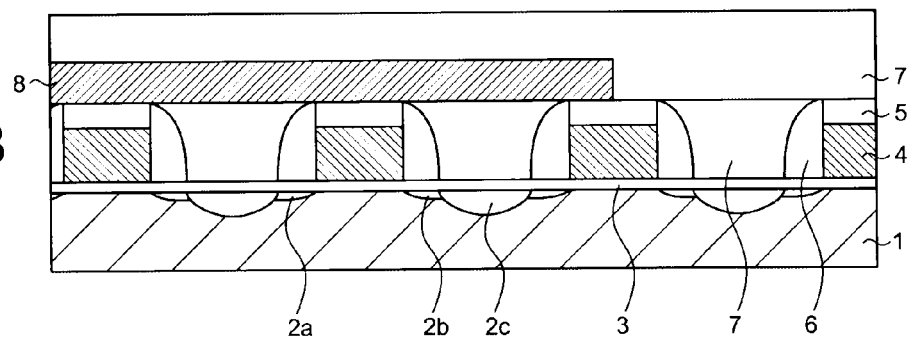

A part of the phase change film 8 is removed by etching in accordance with the RIE method, for example, except the part of the phase change film 8 located above the region of the memory transistors and above a part of the region of the selection transistors. Furthermore, the insulation film 7 is deposited as an interlayer insulation film as shown in FIGS. 12A and 12B.

Figure 13A:
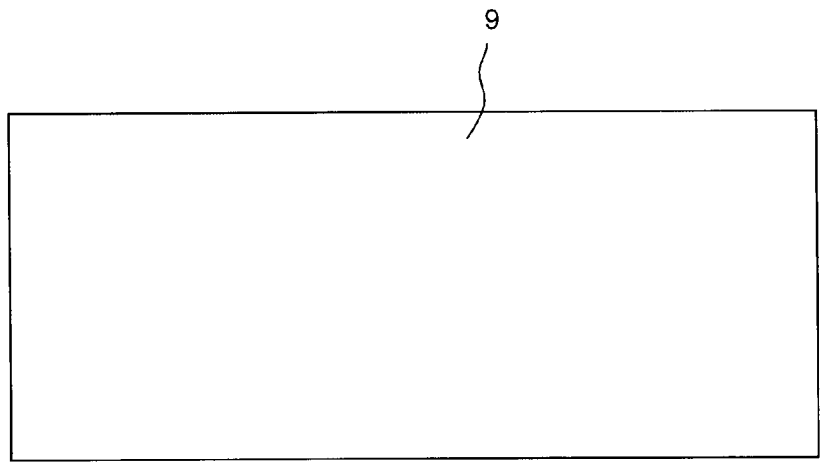
Figure 13B:
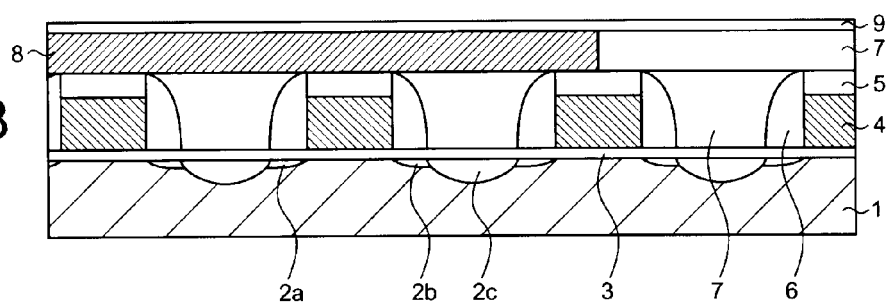

The insulation film 7 is polished by the CMP method, for example, until the phase change film 8 is exposed to form a flat surface together with the insulation film 7. In addition, the insulation film 9 is deposited as an interlayer insulation film on the insulation film 7 and on the phase change film 8 as shown in FIGS. 13A and 13B.

Figure 14A:
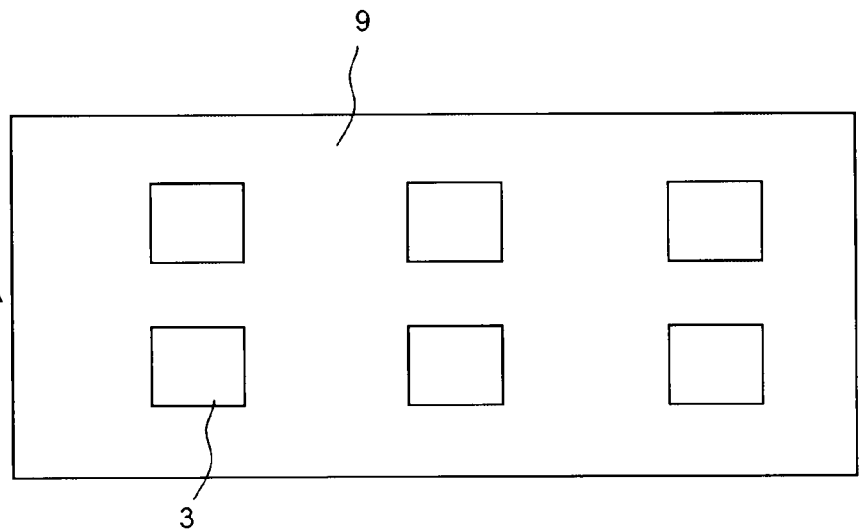
Figure 14B:
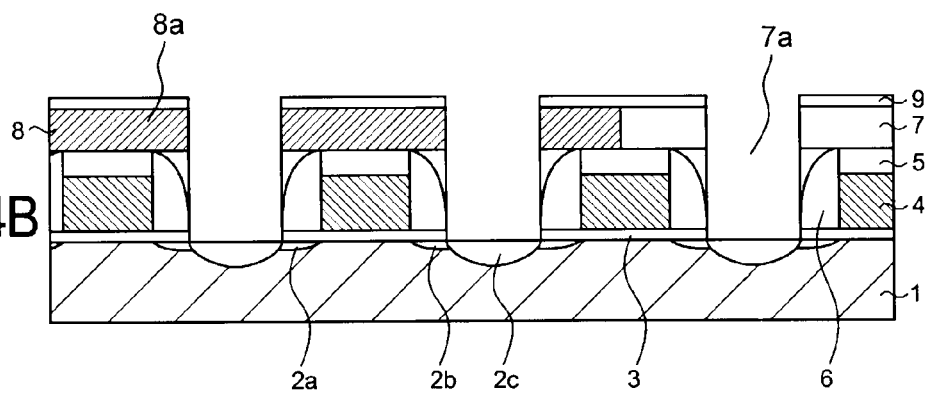

Using a mask of an unillustrated resist film made by a known lithography method, the insulation film 9, the phase change film 8, the insulation film 7 and the gate insulation film 3 are partially removed by etching in accordance with the RIE method, for example. The plural first contact opening portions 7a are thus formed. Then, the resist film is removed. As a result of the formation of the plural first contact opening portions 7a, the plural portions 8a are formed from the phase change film 8 as shown in FIGS. 14A and 14B. The portions 8a may be separated from each other thoroughly or connected partly to each other.

Figure 15A:
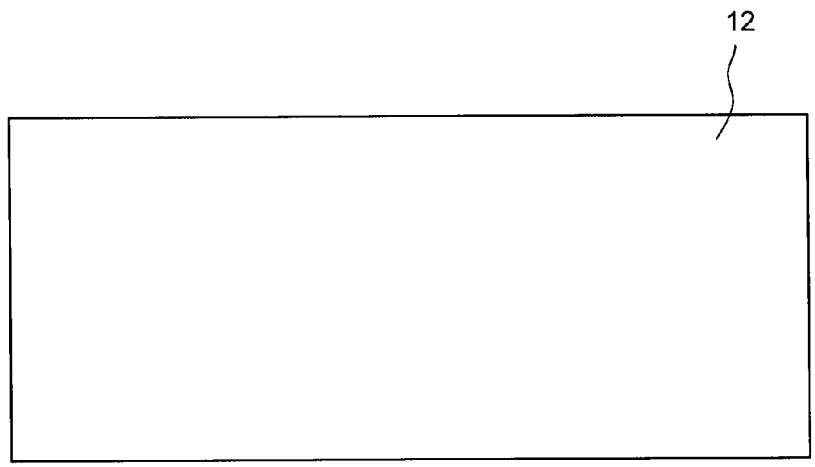
Figure 15B:
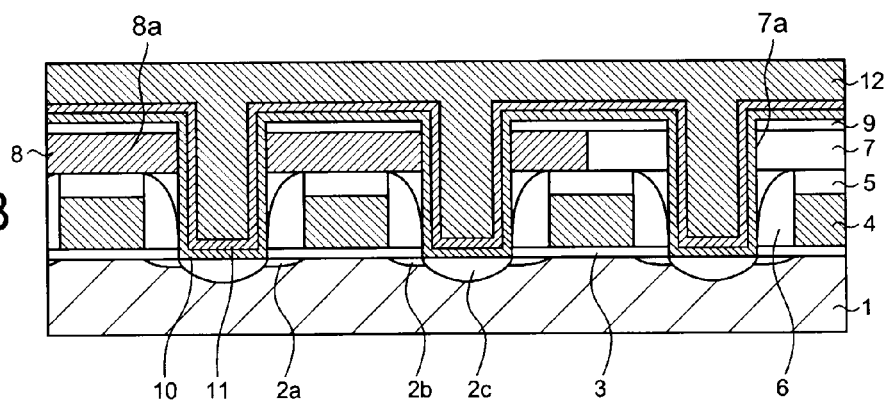

As shown in FIGS. 15A and 15B, on the entire surfaces of the first contact opening portions 7a and of the insulation film 9, layers of the metal film 10, the metal nitride film 11, and the via electrode 12 are formed in this sequence. Titanium (Ti) can be used as the metal used for the metal film 10 and for the metal nitride film 11. Instead, other metals, such as tungsten (W) and aluminum (Al) can be used for the purpose. As the via electrode 12, tungsten (W) can be used. Instead, other metals or carbon nanotube can be used for the purpose.

Figure 16A:
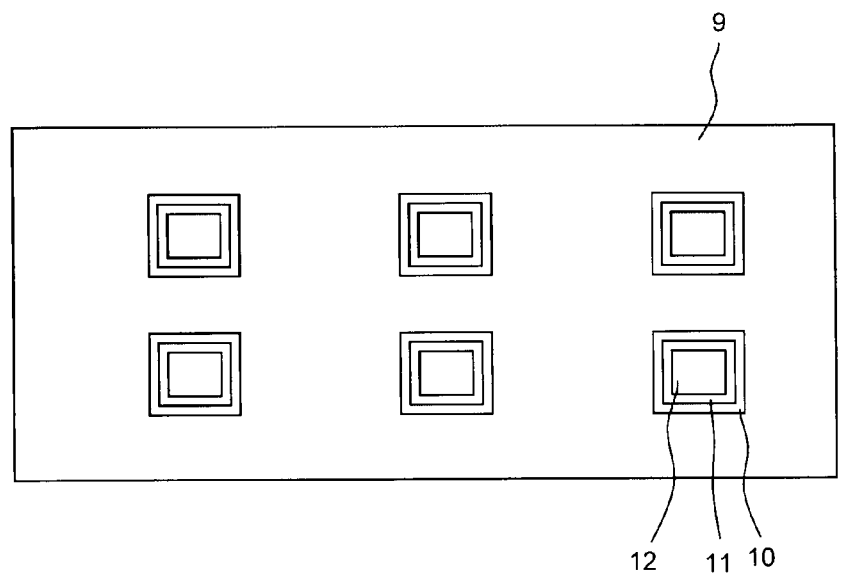
Figure 16B:
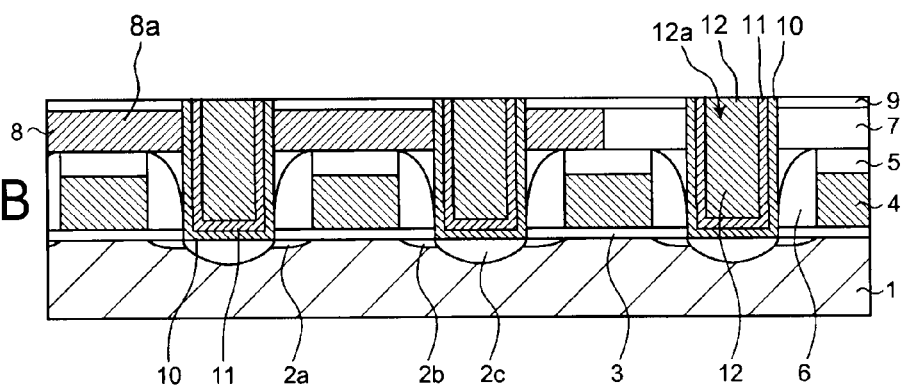

As shown in FIGS. 16A and 16B, the via electrode 12, the metal nitride film 11, and the metal film 10 are polished by the CMP method, for example, until the surface of the insulation film 9 is exposed. As a result, a via 12a is formed.

Figure 17A:
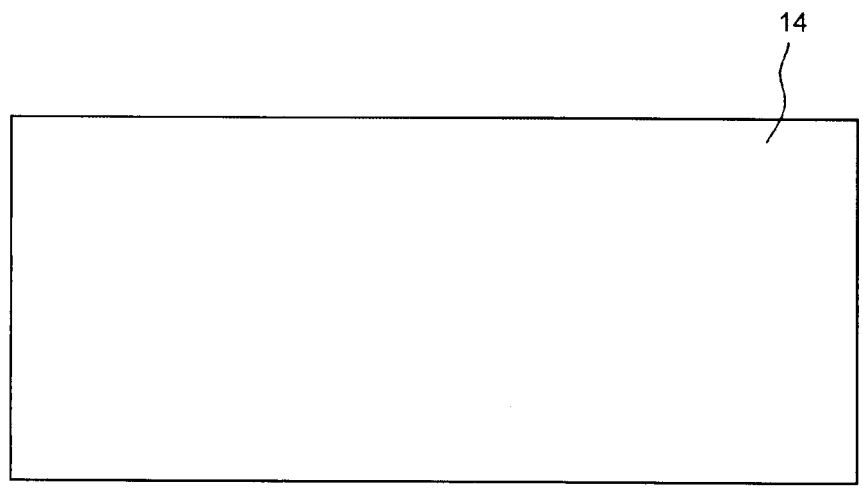
Figure 17B:
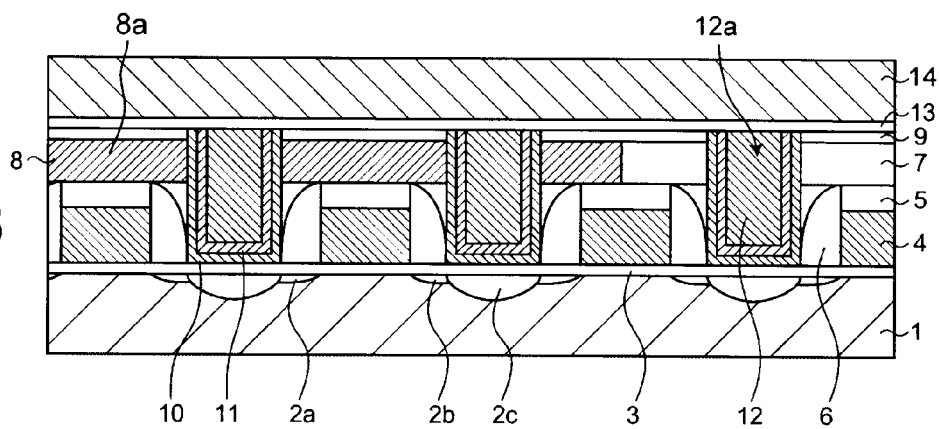

As shown in FIGS. 17A and 17B, layers of the reaction prevention film 13 and of the heat buffer film 14 are formed in this sequence. As the reaction prevention film 13, a silicon nitride (SiN) film, for example, may be used. As the heat buffer film 14, a metal nitride film such as one of titanium nitride (TiN) may be used.

A part of the reaction prevention film 13 and of the heat buffer film 14 is removed by etching in accordance with the RIE method, for example, except the part of the reaction prevention film 13 and of the heat buffer film 14 located above the region of the memory transistors and above a part of the region of the selection transistors. The insulation film 15 (the first one of the kind) is deposited as an interlayer insulation film. After the deposition of the insulation film 15, the insulation film 15 is polished by the CMP method, for example, until the surface of the heat buffer film 14 is exposed.

After the insulation film 15 (the second one of the kind) is deposited, a part of the insulation film 15 is removed. The removed part of the insulation film 15 is located above one of the first opening portions 7a located between the selection transistors, and, in the first opening portion 7a, the metal film 10, the metal nitride film 11, and the via electrode 12 are buried. Thus, the second contact opening portion 15a is formed.

Figure 18A:
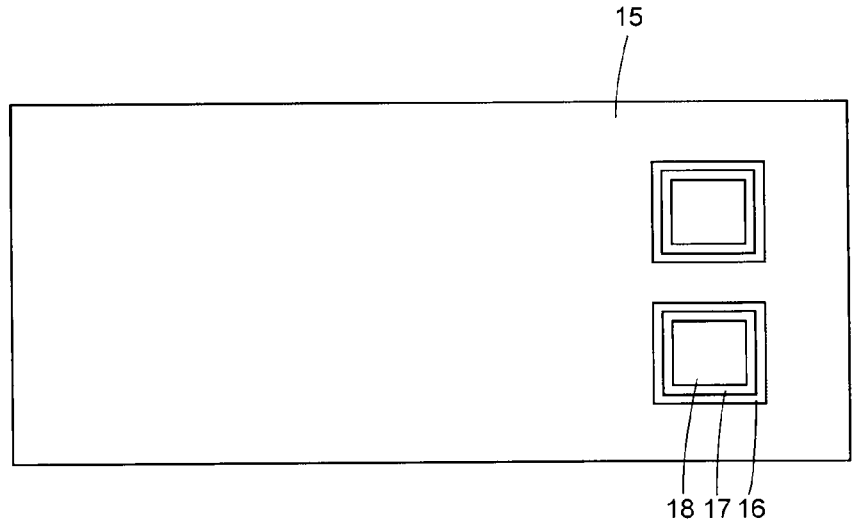
Figure 18B:
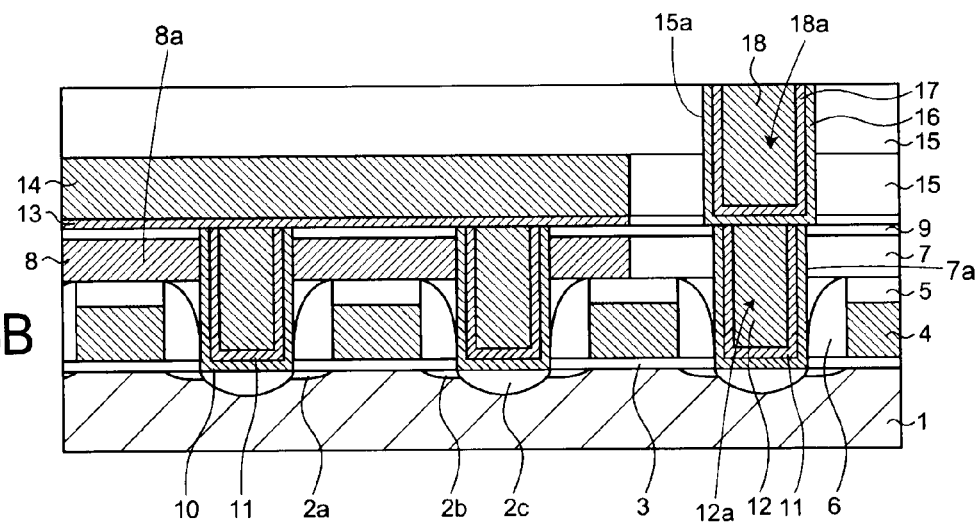

On the second contact opening portion 15a and on the insulation film 15, layers of the metal film 16, of the metal nitride film 17, and of the via electrode 18 are formed in this sequence. Here, titanium (Ti) can be used as the metal used for the metal film 16 and as the metal used for the metal nitride film 17. Instead, other metals, such as tungsten (W) and aluminum (Al), can be used for the purpose. As the via electrode 18, tungsten (W) can be used. Instead, other metals or carbon nanotube can be used for the purpose. Subsequently, the via electrode 18, the metal nitride film 17, and the metal film 16 are polished by the CMP method, for example, until the surface of the insulation film 15 is exposed. Thus, the via 18a is formed as shown in FIGS. 18A and 18B.

After that, as shown in FIG. 2, the wiring layer 19 is formed on the insulation film 15 and is formed as bit line wirings that are in contact with the via 18a. After the formation of the wiring layer 19, interlayer insulation films and other wiring layers are formed by a known technique. Thus, the formation of the phase change memory device 40 is completed.

According to the method of manufacturing the phase change memory device 40, the gate insulation film 3 of each memory transistor is formed on the semiconductor substrate 1. The gate electrode 4 is formed on the gate insulation film 3. The source region 2a and the drain region 2b are formed in the semiconductor substrate 1 so as to sandwich the gate electrode 4.

Some of the vias 12a are formed each between the memory transistors, and between the portions 8a of the phase change film 8 formed above the respective memory transistors. Each of the vias 12a connects the two adjacent portions 8a of the phase change film 8, or connects the source region 2a of one of the two adjacent memory transistors and the drain region 2b of the other one of the two. With each of the vias 12a, each of the memory transistors and the phase change element film are connected in parallel to each other.

Each of the memory cells C1a, . . . , C1h; C2a, . . . , C2h; C11a, . . . C11h; and C22a, . . . , C22h is formed by each of the memory transistors MT1a, . . . , MT1h; MT2a, . . . , MT2h; MT11a, . . . , MT11h; and MT22a, . . . , MT22h and the corresponding one of the phase change film portions 8a. Among the memory cells C1a, . . . , C1h; C2a, . . . , C2h;

C11a, ..., C11h; and C22a, ..., C22h thus formed, those memory cells that are connected to the same bit line and to the same source line are grouped together and connected in series to one another. The via 12a is also used as the contact for the source region 2a and the drain region 2b of each of the selection transistor. Besides, the via 12a is also used as the contact for the high-concentration diffusion layer 2c.

According to the method of manufacturing the phase change memory device 40, the vias 12a are formed in order to connect the memory transistors to each other and in order to connect the memory transistors in parallel to the respective portions 8a of the phase change film 8. The vias 12a used for these purposes can be formed at the same time when the vias 12 used for the purpose of connecting the selection transistors to each other. Accordingly, the phase change memory device 40 can be manufactured with a significantly smaller number of manufacturing processes.

In addition, the phase change film 8 is formed in a flat surface, while the surfaces of the vias 12a and the surface of the insulation film 9 are also formed in a flat surface. The surface of the insulating film 15 is also formed in a flat surface. Accordingly, when the phase change memory device 40 is manufactured, the breaking of wiring becomes less likely to happen in the wiring layer 19 and in the wiring layers provided above the wiring layer 19. As a consequence, each of the wiring layers can be formed in a narrower width with ease while the multiple layer wiring can be achieved with ease.

Note that an amorphous silicon film is used for the gate electrode film 4 in the embodiment, but a metal silicide film or the like may be used for the purpose. Both the reaction prevention film 13 and the heat buffer film 14 are removed by etching at a single process in the embodiment. Alternatively, only the heat buffer film 14 may be removed by etching while the reaction prevention film 13 is left.

Figure 19:
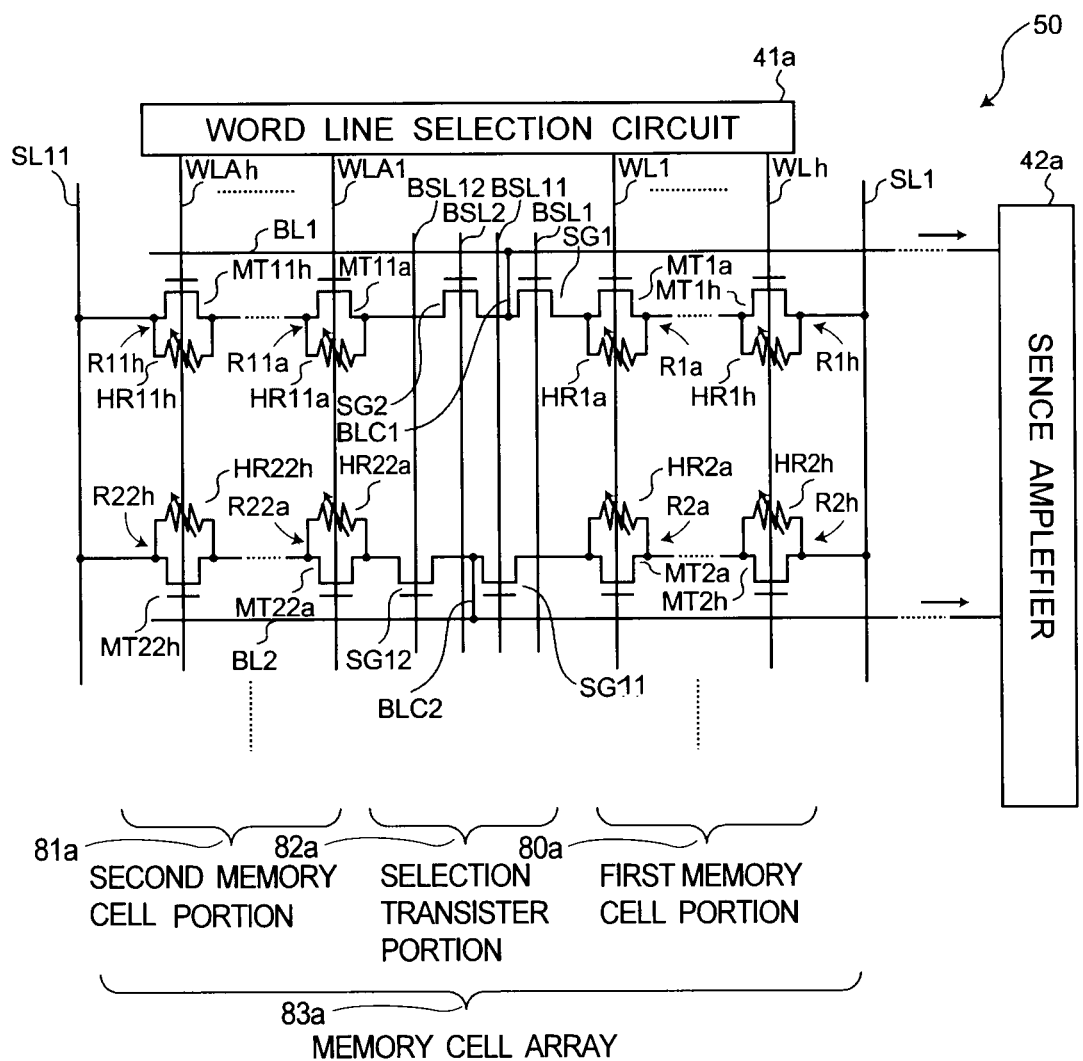
FIG. 19 is a circuit diagram showing a resistance change memory device according to a second embodiment of the present invention.
Figure 20:
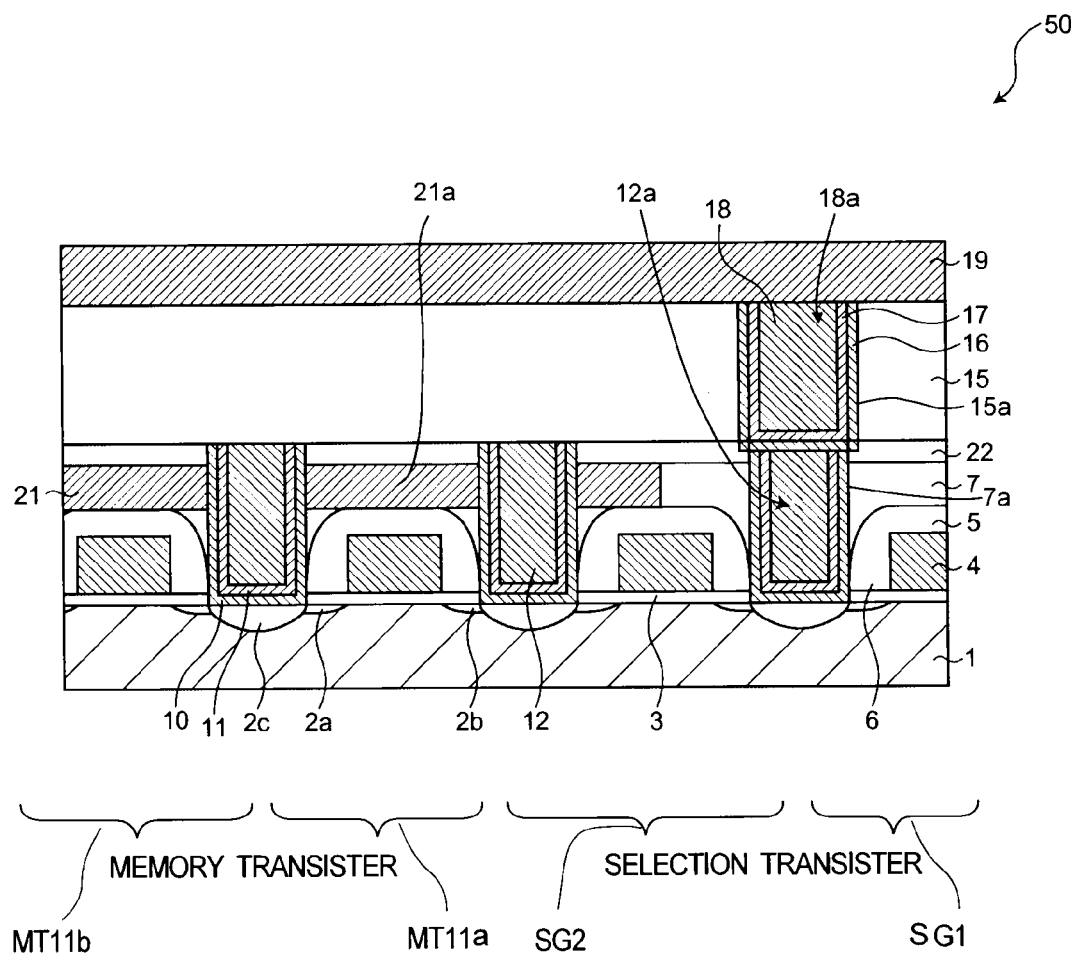
FIG. 20 is a sectional view showing a principal part of a memory cell array of the resistance change memory device of FIG. 19.

A resistance change memory device (PRAM) according to a second embodiment of the invention will be described with reference to FIGS. 19 and 20. FIG. 19 is a circuit diagram showing the resistance change memory device. FIG. 20 is a sectional view showing a principle portion of a memory cell array of the resistance change memory device.

When portions shown in FIGS. 19 and 20 are identical to the respective ones shown in FIGS. 1 and 2, the portions in FIGS. 19 and 20 are given the same reference numerals given in FIGS. 1 and 2.

As shown in FIG. 19, a resistance change memory device 50 includes a memory cell array 83a. The memory cell array 83a includes memory cells R1a, ..., R1h; R2a, ..., R2h; R11a, ..., R11h; and R22a, ..., R22h. The memory cells form a first memory cell portion 80a and a second memory cell portion 81a. Word lines WL1, ..., WLh; and WLA1, ..., WLAh as well as bit lines BL1, BL2, ... are connected to the memory cells. The word lines are connected to a word line selection circuit 41a.

Bit line selection transistors SG1, SG2, SG11, and SG12 are connected between the memory cells and the bit lines BL1, BL2, ....

The bit lines BL1, BL2, ... are connected to a sense amplifier 42a. A data input/output unit (not illustrated) is connected to the sense amplifier 42a to make the input and the output of the data possible. The bit line selection transistors SG1, SG2, SG11, and SG12 form a selection transistor portion 82a.

The memory cells R1a, ..., R1h; R2a, ..., R2h; R11a, ..., R11h; and R22a, ..., R22h are arranged in parallel to the bit lines BL1, B12, ....

Each of the memory cells includes one of memory transistors MT1a, ..., MT1h; MT2a, ..., MT2h; MT11a, ..., MT11h; and MT22a, ..., MT22h, as well as a corresponding one of resistance change elements HR1a, ..., HR1h; HR2a, ..., HR2h; HR11a, ..., HR11h; and HR22a, ..., HR22h. The resistance change elements are plural portions of a resistance change film while the plural portions correspond, respectively, to the memory transistors.

The memory transistors MT1h and MT2h, which are located at the most right-hand side in the drawing among the memory transistors, are connected to a source line SL1. On the other hand, the memory transistors MT11h and MT22h, which are located at the most left-hand side in the drawing among the memory transistors, are connected to a source line SL11.

In each memory cell, one of the memory transistors is connected in parallel to the corresponding one of the resistance change elements. Every h memory cell is connected in series to one another (or in cascade connection) so as to be in parallel to bit lines BL1 and BL2.

Here, h is an integer that is not smaller than 2 while the maximum value of h is determined in accordance with the electric properties that are required for the Chain ReRAM.

The resistance change memory device 50 is a Chain ReRAM (Resistive Random Access Memory).

Specifically, the source region of each memory transistor is connected to a first end of each resistance change element while the drain region of the memory transistor is connected to a second end of the resistance change element. The gate of the memory transistor is connected to the corresponding one of the word lines.

A selection transistor portion 82a is formed between the first memory cell portion 80a and the second memory cell portion 81a. The selection transistors SG1, SG2, SG11, and SG12 are connected to the bit lines BL1 and BL2 as well as to selection lines BSL1, BSL2, BSL11, and BSL12 in the same relationships as in the case of FIG. 1.

The source region of the selection transistor SG1 is connected to the memory transistor MT1a and the resistance change element HR1a. The source region of the selection transistor SG2 is connected to the memory transistor MT11a and the resistance change element HR11a. The source region of the selection transistor SG11 is connected to the memory transistor MT2a and the resistance change element HR2a. The source region of the selection transistor SG12 is connected to the memory transistor MT22a and the resistance change element HR22a.

The drain region of the selection transistor SG1 and the drain region of the selection transistor SG2 are connected to the bit line BL1 via a bit line connection line BLC1. The drain region of the selection transistor SG11 and the drain region of the selection transistor SG12 are connected to the bit line BL2 via a bit line connection line BLC2.

The word line selection circuit 41a outputs word line control signals to the gate of each memory transistor of the first and the second memory cell portions 80a and 81a via the word lines WL1, ..., WLh, and WLA1, ..., WLAh. The On/OFF action of each memory transistor of the first and the second memory cell portions 80a and 81a is performed on the basis of the word line control signal and thus selection of the resistance change element is performed. Accordingly made possible are the writing and the reading of data in the following way.

Data is inputted into the sense amplifier 42a from the data input/output unit (not illustrated), and then the data is written in the selected memory cell via the corresponding ones of the bit lines BL1, BL2, ..., of the bit line connection lines BLC1, BLC2, ..., and of the selection transistors SG1, SG2, SG11, and SG12. The data stored in the selected memory cell is read out to the sense amplifier 42a via the corresponding ones of the selection transistors SG1, SG2, SG11, and SG12, of the bit line connection lines BLC1, BLC2, ..., and of the bit lines BL1, BL2, ..., and is then amplified. The data amplified in the sense amplifier 42a is outputted from the data input/output unit (not illustrated).

The principal part of the resistance change memory device 50 has such a structure as shown in FIG. 20.

As shown in FIG. 20, the memory transistors MT11a and MT11b as well as the selection transistors SG1 and SG2 in the resistance change memory device 50 have the same structure as those shown in FIG. 2.

Insulation films 5, insulation films 6, and insulation films 7 are formed on or above the memory transistors MT11a and MT11b as well as above the selection transistors SG1 and SG2.

Plural portions 21a of a resistance change film 21 is formed on a surface formed by the insulation films 5, 6, and 7. Each of the plural portions 21a forms a part of a resistance change element. The locations of the portions 21a correspond to memory transistors respectively. These portions 21a may be separated from each other thoroughly or connected partly to each other.

Insulation films 22 are formed as interlayer insulation films so as to cover the top of the resistance change film 21 and the top of the above-mentioned thicker parts of the insulation films 7.

As in the case shown in FIG. 2, first contact opening portions 7a are formed in the insulating films 7 and in the insulation film 22 located above the high-concentration diffusion layers 2c serving as contact diffusion layers. Openings are formed also in the resistance change film 21 in a case where the resistance change film 21 exists under the insulation film 7. The openings thus formed in the resistance change film 21 form a part of the respective first contact opening portions 7a. A metal film 10, a metal nitride film 11 and a via electrode 12 are buried in each first contact opening portion 7a. The metal film 10, the metal nitride film 11, and the via electrode 12 form a via 12a.

An insulation film 15 is formed on the vias 12a and the insulation film 22. A second contact opening portion 15a is formed in the insulation film 15. A metal film 16, a metal nitride film 17 and a via electrode 18 are buried in the second contact opening portion 15a.

The metal film 16, the metal nitride film 17, and the via electrode 18 form a via 18a. On the via 18a and the insulation film 15, a wiring layer 19 is formed as wirings of bit lines. The wiring layer 19 is electrically connected to the via 18a.

As in the case of the phase change memory device 40 of the first embodiment, in the resistance change memory device 50 of the second embodiment, the vias 12a to connect the memory transistors with one another and to connect each of the memory transistors in parallel to the corresponding portions 21a of the resistance change film 21 can be formed simultaneously with the vias 12a to connect the selection transistors SG1, SG2, SG11, and SG12. Accordingly, the resistance change memory device 50 can be manufactured with a significantly smaller number of manufacturing processes.

In addition, the resistance change film 21 is formed in a flat surface while the surfaces of the vias 12a and the surface of the insulation film 9 are formed in a flat surface. In addition, the surface of the insulation film 15 is also formed in a flat surface.

Accordingly, when the resistance change memory device 50 is manufactured, the breaking of wiring becomes less likely to happen in the wiring layer 19 and in the wiring layers provided above the wiring layer 19. As a consequence, each of the wiring layers can be formed in a narrower width with ease while the multiple layer wiring can be achieved with ease.

Figure 21A:
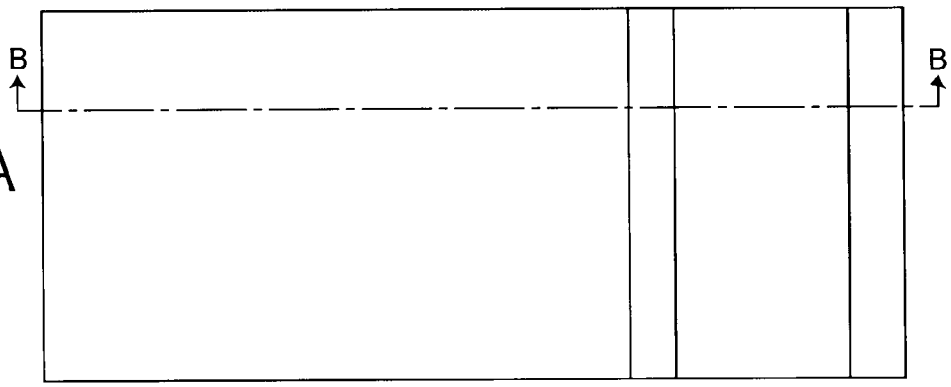
FIG. 21A is a plan view showing a manufacturing step of the resistance change memory device of the second embodiment.
Figure 21B:
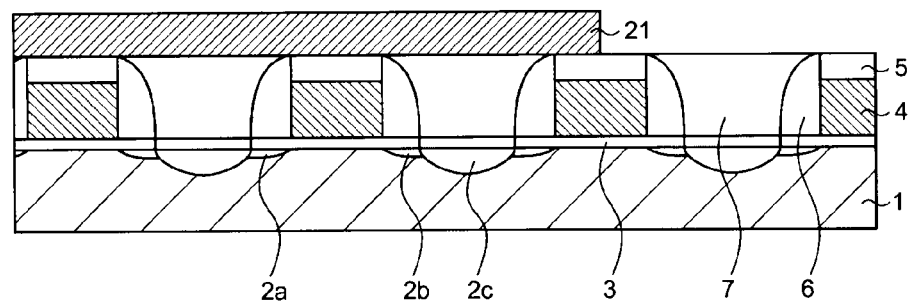
FIG. 21B is a sectional view corresponding to FIG. 21A.

A method of manufacturing the resistance change memory device 50 will be described with reference to FIGS. 21A and 21B. FIG. 21A is a plan view of a principal part of a wafer where the resistance change memory device 50 is being formed. FIG. 21B is a sectional view taken along the line B-B in FIG. 21A.

The manufacturing processes up to the polishing of the insulation film 7 as an interlayer insulation film by the CMP method are the same as those performed in the first embodiment.

After the polishing of the insulation film 7, the resistance change film 21 is deposited on the insulation films 5 to 7. Then, as shown in FIGS. 21A and 21B, the resistance change film 21 is partially removed by etching in accordance with the RIE method, for example, except the resistance change film 21 located above the memory transistors and above a part of the selection transistor. A transition metal oxide film can be used as the resistance change film 21.

An insulation film to form the insulation film 7 as an interlayer insulation film shown in FIG. 20 is deposited on the entire surface. Then, the insulation film thus deposited is polished by the chemical mechanical polishing (CMP) method, for example, until the surface of the resistance change film 21 is exposed. Thus, the entire surface is formed in a flat surface. Next, the interlayer insulation film 22 shown in FIG. 20 is deposited. After that, using a mask of a resist film (not illustrated) made by a known lithography method, the insulation film 22, the resistance change film 21, the insulation film 7 and the gate insulation film 3 are partially removed by etching in accordance with the RIE method, for example. The first contact opening portions 7a shown in FIG. 20 are thus formed. Then, the resist film is removed. As a result of the formation of the first contact opening portions 7a, the plural portions 21a are formed from the resistance change film 21. These portions 21a may be separated from each other thoroughly or connected partly to each other.

Layers of a metal film, of a metal nitride film, and of a via electrode are deposited in this sequence in order to form the metal film 10, the metal nitride film 11, and the via electrode 12, which are to be buried in the first contact opening portions 7a shown in FIG. 20.

Then, the metal film, the metal nitride film, and the via electrode are polished by the CMP method, for example, until the surface of the insulation film 22 is exposed. Thus, the via electrodes 12, the metal nitride films 11, and the metal films 10 are formed. Subsequently, an insulation film to form the insulation film 15 as an interlayer insulation film shown in FIG. 20 is formed on the entire surface. Parts of the insulation film are etched, and thus, the insulation film 15 with the first contact opening portion 15a shown in FIG. 20 is formed.

In the processes that follow, the vias 18a and the wiring layer 19 are formed in a similar way to that of the first embodiment.

According to the method of manufacturing the resistance change memory device 50, the vias 12a are formed in order to connect the memory transistors to each other and in order to connect the memory transistors in parallel to the respective portions 21a of the resistance change film 21. The vias 12a used for these purposes can be formed at the same time when the vias 12 used for the purpose of connecting the selection transistors to each other. Accordingly, the resistance change memory device 50 can be manufactured with a significantly smaller number of manufacturing processes.

In addition, the resistance change film 21 is formed in a flat surface, while the surfaces of the vias 12a and the surface of the insulation film 9 are also formed in a flat surface. The surface of the insulating film 15 is also formed in a flat surface.

Accordingly, when the resistance change memory device 50 is manufactured, the breaking of wiring becomes less likely to happen in the wiring layer 19 and in the wiring layers provided above the wiring layer 19. As a consequence, each of the wiring layers can be formed in a narrower width with ease while the multiple layer wiring can be achieved with ease.

Note that a transition metal oxide film is used for the resistance change film 21 in the embodiment, but a perovskite-type oxide film doped with a transition metal may be used for the purpose. Note that the transition metal oxide film mentioned above is a film of a transition metal oxide including a nickel oxide, a niobium oxide, a copper oxide, a hafnium oxide, or a zirconium oxide.

Figure 22:
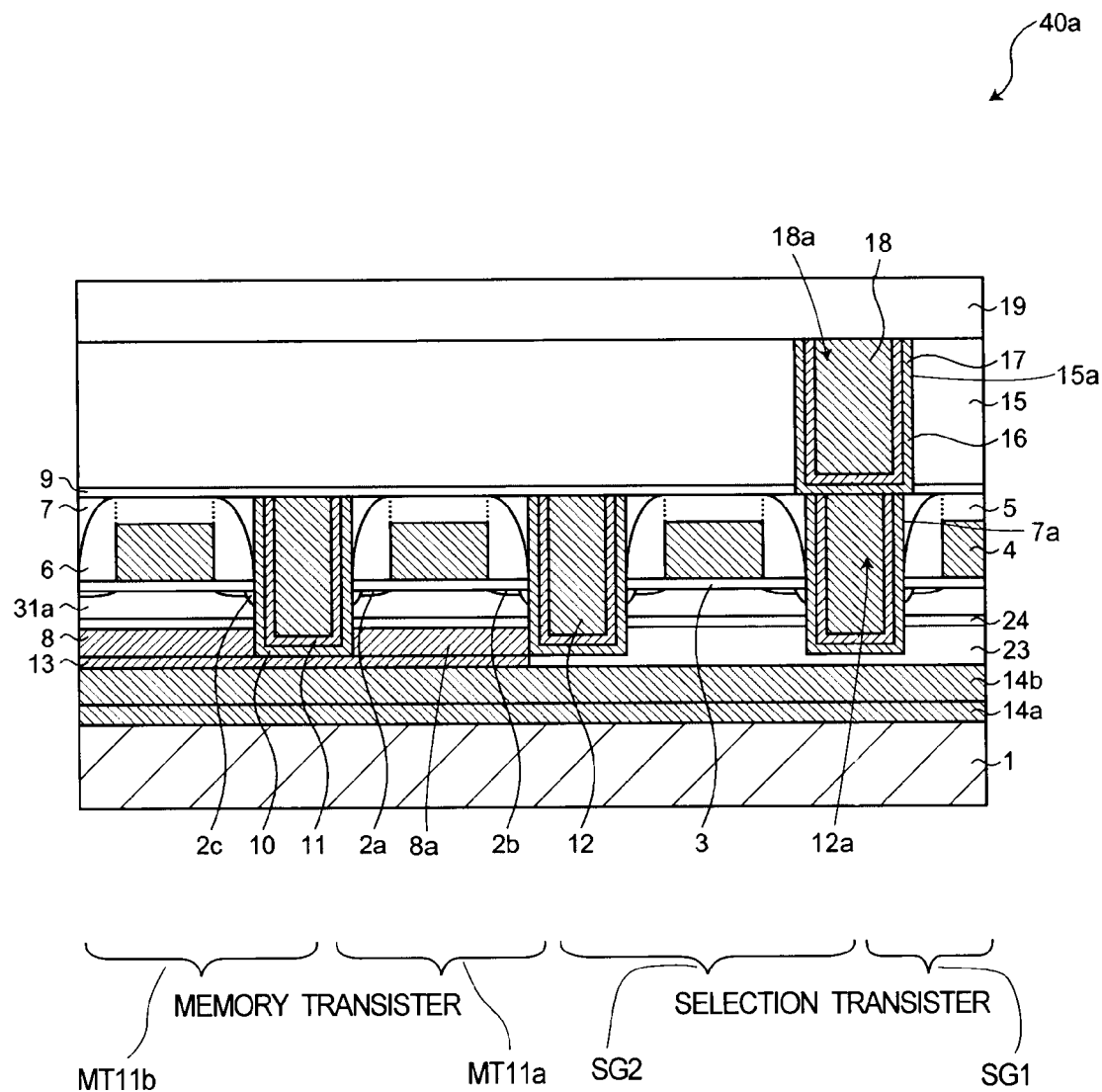
FIG. 22 is a sectional view showing a principal part of a memory cell array of a phase change memory device according to a third embodiment of the present invention.

A phase change memory device according to a third embodiment of the invention will be described with reference to FIG. 22. FIG. 22 is a sectional view showing a principle portion of a memory cell array of the phase change memory device. When portions shown in FIG. 22 are identical to the respective ones shown in FIG. 1, the portions in FIG. 22 are given the same reference numerals given in FIG. 1.

The circuit of a phase change memory device 40a according to the third embodiment is identical to the circuit of the phase change memory device 40 according to the first embodiment shown in FIG. 1.

The phase change memory device 40a according to the third embodiment has a structure in which memory transistors are formed on top of respective phase change films 8. The structure, which will be described below, is an upside-down structure of that of the phase change memory device 40 according to the first embodiment shown in FIG. 2. The memory transistors are formed on top of a silicon-on-insulator (SOI) substrate.

The structure of the phase change memory device 40a will be described in detail.

In FIG. 22, layers of a first heat buffer film 14a and a second heat buffer film 14b are formed on a first principal surface of a semiconductor substrate 1. The heat buffer films 14a and 14b are connected to source lines SL1 and SL11, which are identical to those shown in FIG. 1.

On the heat buffer film 14b, a reaction prevention film 13, and a phase change film 8 is formed in a portion where memory transistors MT11a and MT11b are to be formed. On the heat buffer film 14b, an insulation film 23 as an interlayer insulation film is formed in a portion where bit line selection transistors SG1 and SG2 are to be formed. On top of the phase change film 8 and on top of the insulation film 23, layers of an insulation film 24 as an interlayer insulation film and of a semiconductor film 31a are formed. The conductive type of the semiconductor film 31a is p type, for example.

In some parts of the first principal surface of the semiconductor film 31a, layers of gate insulation films 3, of gate electrode films 4, and of insulation films 5 are formed. In the semiconductor film 31a, a source region 2a, a drain region 2b, and high-concentration diffusion layers 2c, all of which have an opposite conductive type to that of the semiconductor film 31a, are formed so as to sandwich each of the gate electrode films 4. The high-concentration diffusion layers 2c are formed more deeply into the semiconductor film 31a than the source regions 2a and the drain regions 2b, and serve as contact diffusion layers for the memory transistors MT11a and MT11b. The high-concentration diffusion layers 2c may be separated from each other by the first contact openings 7a thoroughly or connected partly to each other.

Insulation films 6 are provided to cover the top surfaces of the gate insulation films 3, the side surfaces of the gate electrode films 4, and the side surfaces of the insulation films 5. Thus, the insulation films 6 serve as side-wall films. Insulation films 7, which serve as interlayer insulation films, are formed to fill the portions around the insulation films 5 and 6. On top of the insulation films 5 to 7, an insulation film 9 is formed as an interlayer insulation film.

First contact opening portions 7a are formed between the memory transistors MT11a and MT11b, between the memory transistors MT11a and a selection transistor SG2, and between selection transistors SG1 and SG2. Each of the first contact opening portions 7a penetrates the corresponding one of the high-concentration diffusion layers 2c. As a result, each high-concentration diffusion layer 2c is separated into two regions.

The high-concentration diffusion layers 2c, which adjoin each other with the first contact openings 7a respectively, may be connected partly to one another.

The bottom of the first contact opening portion 7a that is formed between the memory transistors MT11a and MT11b comes into contact with the reaction prevention film 13. Meanwhile, the bottom of the first contact opening portion 7a that is formed between the memory transistor MT11a and the selection transistor SG2 comes into contact with the insulation film 23, and so does the bottom of the first contact opening portion 7a that is formed between the selection transistors SG1 and SG2.

As a result of the formation of the first contact opening portions 7a, the phase change film 8 comes to include portions 8a corresponding respectively to the memory transistors. These portions 8a may be separated from each other thoroughly or connected partly to each other.

Metal films 10, metal nitride films 11 and via electrodes 12 are buried in the first contact opening portions 7a, and form vias 12a.

The vias 12a buried in the respective first contact opening portions 7a formed between the memory transistors MT11a and MT11b as well as between the memory transistor MT11a and the selection transistor SG2 are electrically connected to the phase change film 8 and to the corresponding high-concentration diffusion layers 2c.

The via 12a buried in the first contact opening portion 7a formed between the selection transistors SG1 and SG2 is electrically connected to the high-concentration diffusion layer 2c. One of the portions 8a of the phase change film 8 and the corresponding one of the memory transistors formed above the respective portions 8a form each memory cell.

Layers of insulation films 9 and 15 are formed as interlayer insulation films on the insulation films 5 to 7 and on the vias 12a.

A second contact opening portion 15a is formed in a part of the insulation films 9 and 15 which part is located on the via 12a formed between the selection transistors SG1 and SG2. A metal film 16, a metal nitride film 17 and a via electrode 18 are buried in the second contact opening portion 15a, and form a via 18a.

On the via 18a and the insulation film 15, a wiring layer 19 is formed as wirings of bit lines. The wiring layer 19 is connected to the via 18a.

The memory transistors and the selection transistors are arranged so as to be located respectively on the left-hand and the right-hand sides of the second contact opening portion 15a in the drawing (that is, are arranged mirror-symmetrically with the center of the second contact opening portion 15a being the center line of the symmetry). The gate electrode film 4 of each memory transistor is connected to the corresponding one of the word line wirings with the unillustrated via electrode and the like.

The reaction prevention film 13 is provided to prevent, the phase change film 8, the via 12a and the heat buffer films 14a and 14b from reacting during the process of the heat treatment in the manufacturing of the phase change memory device 40a and to prevent the constituent substances of the phase change film 8 from being diffused. As the reaction prevention film 13, a silicon nitride (SiN) film can be used, for example.

In the phase change memory device 40a described thus far, the vias 12a buried in the first contact opening portions 7a electrically connect the portions 8a of the phase change film 8 to the source regions 2a and the drain regions 2b of the memory transistors.

The source region 2a of one of the two adjacent select transistors is electrically connected to the drain region 2b of the other of the two with the via 12a buried in the corresponding one of the first contact opening portions 7a.

The heat buffer films 14a and 14b are formed to be flat in the horizontal direction, or in parallel to the first principal surface of the semiconductor substrate 1, with no difference in level formed within each top surface. Similarly formed are the phase change film 8, the insulation film 9 and the insulation film 15, which are formed above the heat buffer films 14a and 14b.

In the embodiment, the vias 12a to connect the memory transistors MT1a, . . . , MT1h, MT2a, . . . , MT2h, MT11a, . . . , MT11h, and MT22a, . . . , MT22h with one another and to connect each of the memory transistors in parallel to the corresponding portions 8a of the phase change film 8 can be formed simultaneously with the vias 12a to connect the selection transistors SG1, SG2, SG11, and SG12. Accordingly, the phase change memory device 40a can be manufactured with a significantly smaller number of manufacturing processes.

In addition, the phase change film 8, the insulation film 9, and the insulation film 15 are formed in respective flat surfaces. Accordingly, when the phase change memory device 40a is manufactured, the breaking of wiring becomes less likely to happen in the wiring layer 19 and in the wiring layers provided above the wiring layer 19. As a consequence, each of the wiring layers can be formed in a narrower width with ease while the multiple layer wiring can be achieved with ease.

A method of manufacturing the phase change memory device 40a will be described with reference to FIGS. 23A to 32A and FIGS. 23B to 32B. FIGS. 23A to 32A are plan views of a principal part of a wafer where the phase change memory device 40a is being formed. FIGS. 23B to 32B are sectional views of respective FIGS. 23A to 32B taken along the line C-C in FIG. 23A and the like.

Figure 23A:
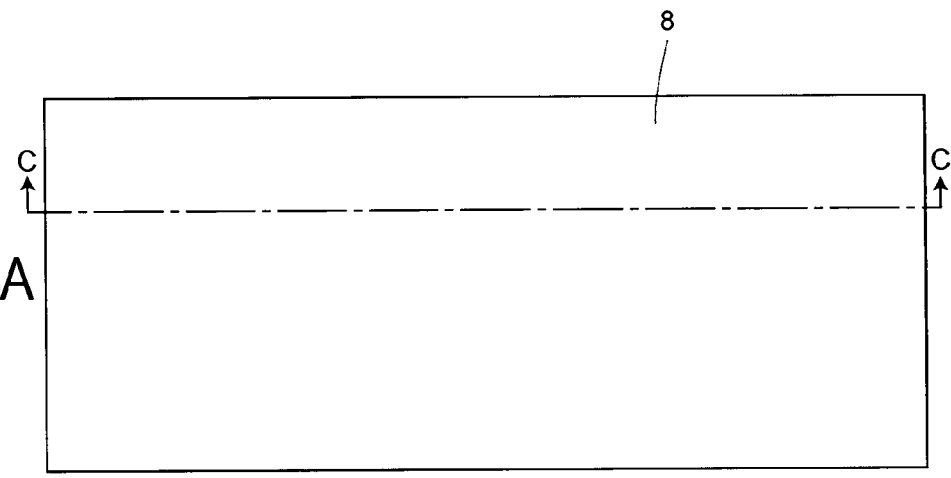
Figure 23B:
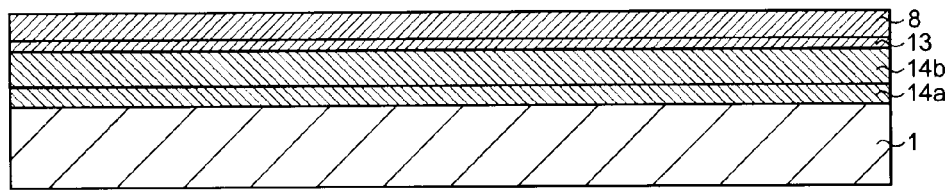

To begin with, as shown in FIGS. 23A and 23B, on top of the first principal surface of the semiconductor substrate 1, layers of the heat buffer films 14a and 14b, of the reaction film 13, and of the phase change film 8 are formed in this sequence. A p type silicon substrate, for example, can be used for the semiconductor substrate 1. Metals, such as titanium (Ti) and tungsten (W) can be used for the heat buffer film 14a. Meanwhile, titanium nitride (TiN) can be used for the heat buffer film 14b. Instead, a nitride of a metal, such as tungsten (W) may be used for the purpose.

Figure 24A:
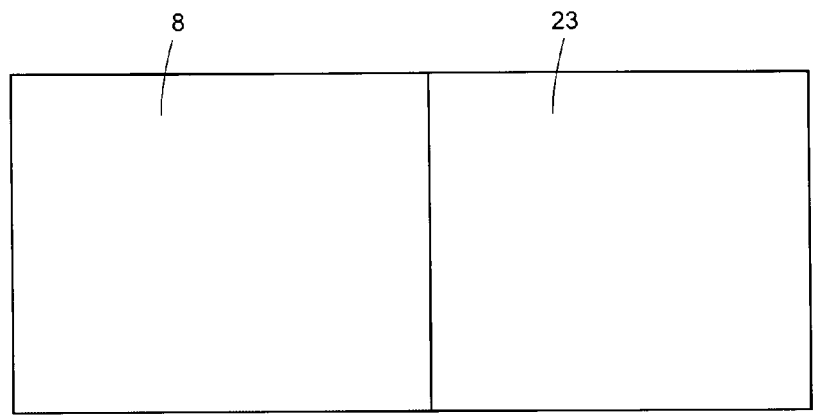
Figure 24B:
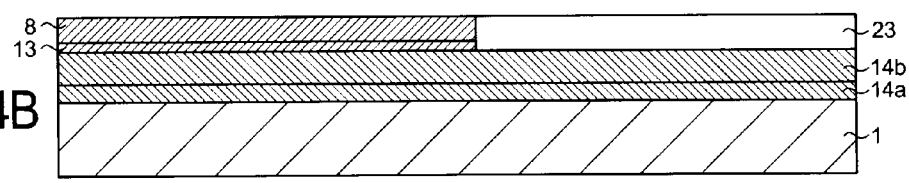

The phase change film 8 and the reaction prevention film 13 are removed by etching in accordance with the RIE method, for example, except the region where the memory transistors are to be formed later. Then, the insulation film 23 is deposited as an interlayer insulation film. After that, the insulation film 23 is polished to have a flat surface by the CMP method, for example, until the surface of the phase change film 8 is exposed as shown in FIGS. 24A and 24B.

Figure 25A:
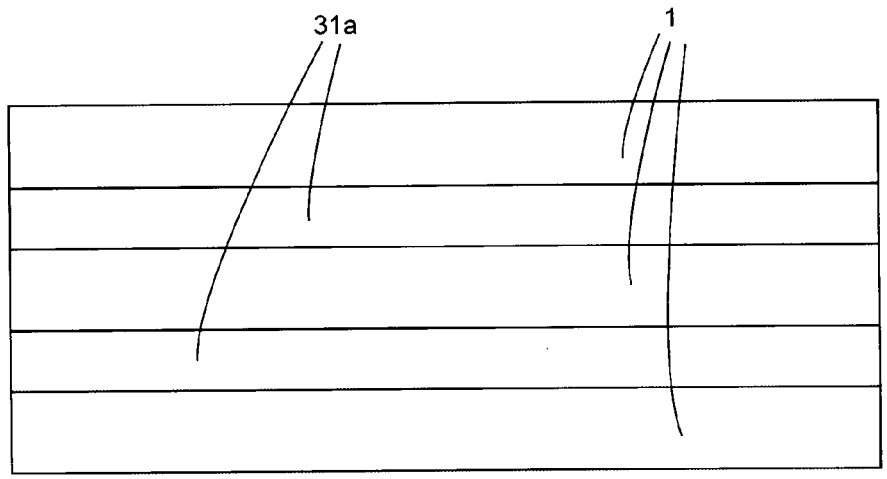
Figure 25B:
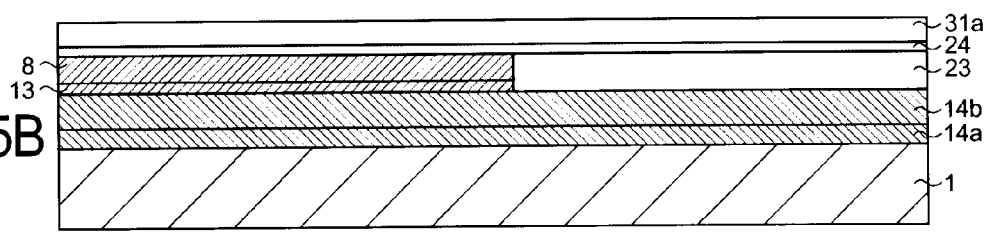

After the deposition of the interlayer insulation film 24, the semiconductor film 31a that is to be a p type SOI substrate is formed, as shown in FIGS. 25A and 25B, through silicon epitaxial growth, for example.

In order to form the SOI substrate 31a, it is preferable to employ a method of epitaxial growth of silicon under a relatively low temperature. A reason for this low temperature is that such a low temperature may prevent the deformation of the heat buffer films 14a and 14b as well as of the phase change film 8. Another reason is that the low temperature may prevent the reaction prevention film 13 from losing its ability to prevent the reaction between the phase change film 8 and the heat buffer films 14a and 14b.

After the epitaxial growth of the silicon, by use of a mask of an unillustrated resist film made by a known lithography method, the semiconductor film 31a is removed by etching in accordance with the reactive ion etching (RIE) method, for example, except the region of the elements such as the selection transistors, until the surface of the semiconductor substrate 1 is exposed. After that, the resist film is removed.

Figure 26A:
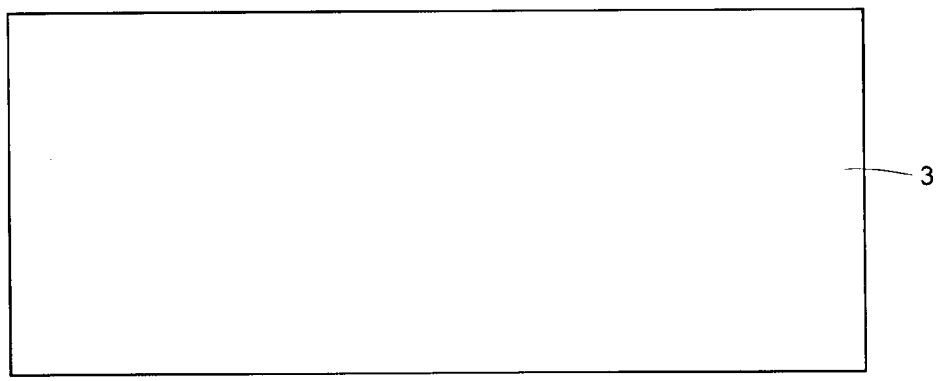
Figure 26B:
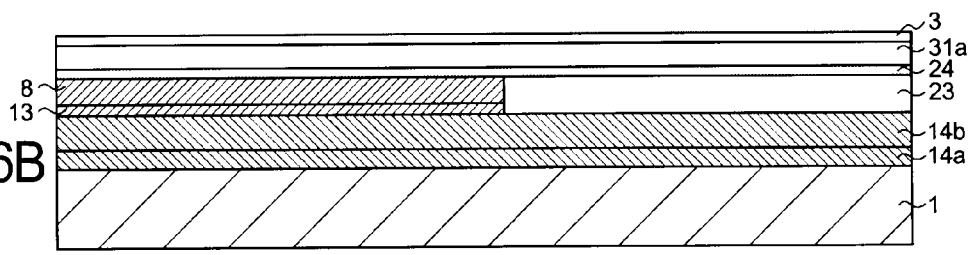
Figure 27A:
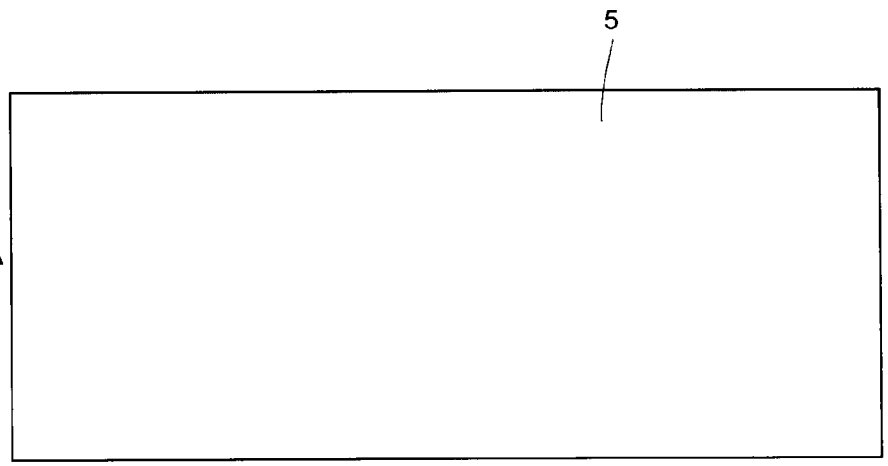
Figure 27B:
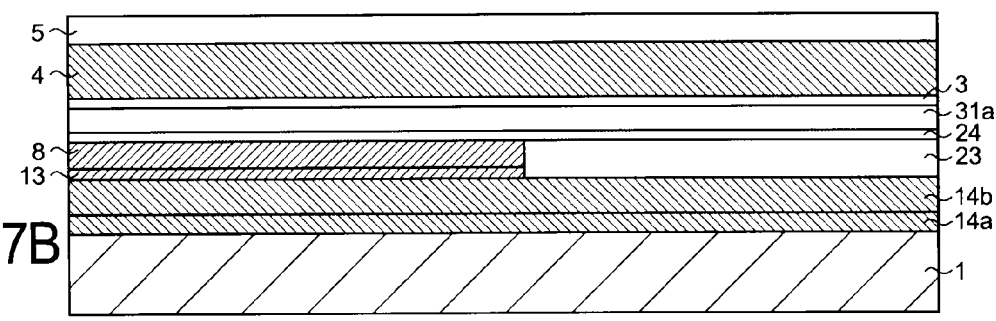

As shown in FIGS. 26A and 26B, the gate insulation film 3 is formed on a first principal surface of the semiconductor film 31a. A high-dielectric film (High-K gate insulation film) that can be formed at a relatively low temperature can be used as the gate insulation film 3. Besides, examples that can be used for the purpose are: a $SiN_xO_y$ film made by thermally nitrifying a silicon oxide film; a laminating film of a silicon nitride ($Si_3N_4$) film and of a silicon oxide film; and a silicon oxide film made by thermally oxidizing a silicon film.

Layers of the gate electrode film 4 and of the insulation film 5 are formed in this sequence. Here, a high-concentration amorphous silicon film into which impurities have been densely doped and which is formed at a relatively low temperature can be used as the gate electrode film 4. Alternatively, a polycrystalline silicon film of a high concentration of impurities may be used for the purpose.

Figure 28A:
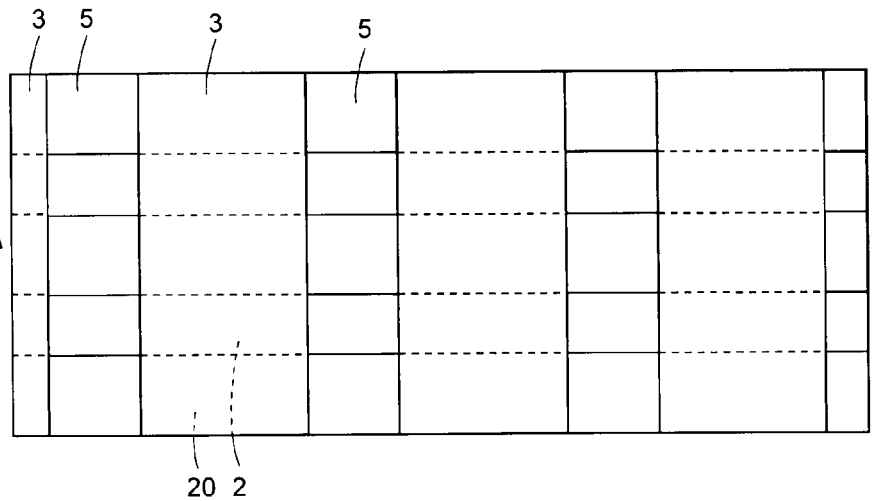
Figure 28B:
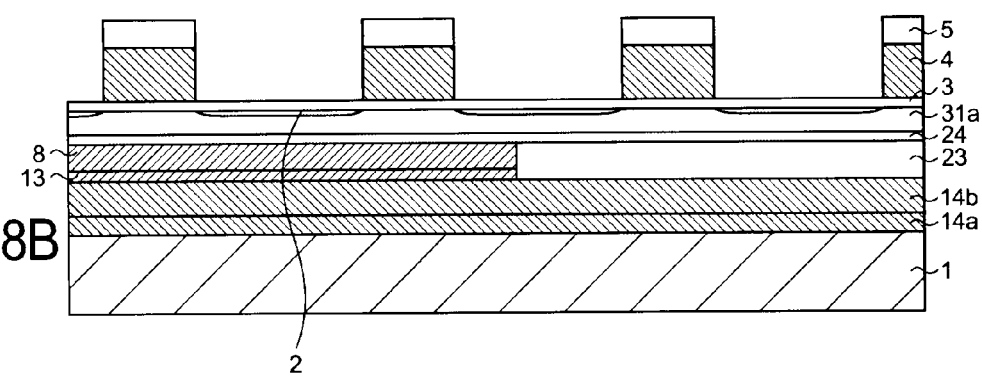

Then, the insulation film 5 and the gate electrode film 4 are partially removed by etching in accordance with the RIE method, for example. Using the gate electrode film 4 and the insulation film 5 as a mask, ions of n type impurities are implanted from the first principal surface side of the semiconductor substrate 1 by the ion-implantation method, for example. The layer into which the ions have been implanted is activated by a heat treatment, and thus a high-concentration diffusion layer 2 is formed as shown in FIGS. 28A and 28B. Subsequently, the insulation film 6 is formed on the entire surface.

Figure 29A:
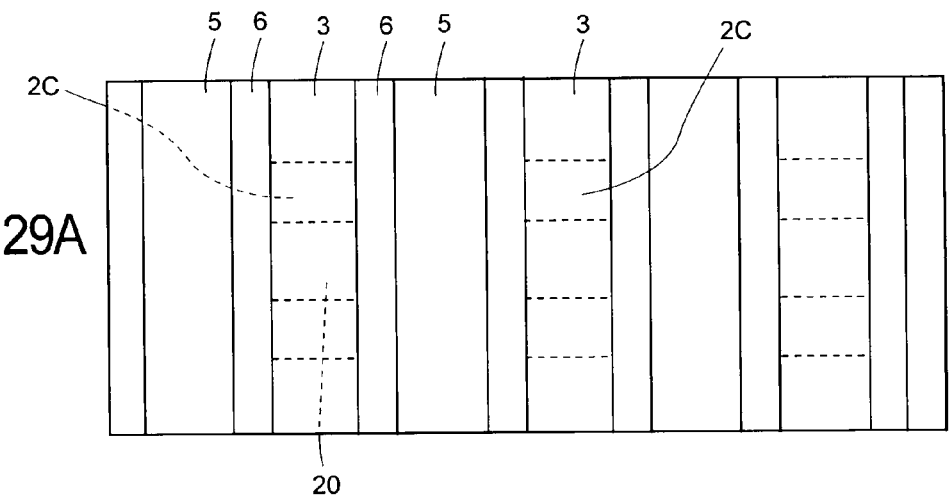
Figure 29B:
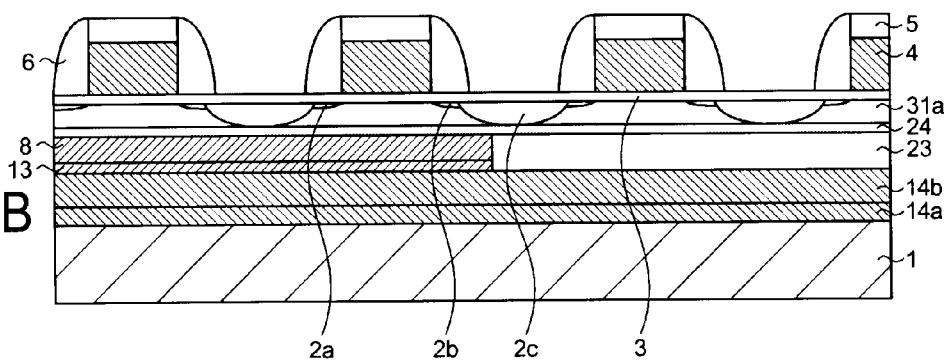

After that, the insulation film 6 is etched by the RIE method, for example, while parts of the insulation film 6 that are in the gate sidewall portions are left as shown in FIGS. 29A and 29B. Ions of impurities of the same conductive type as that of the high-concentration diffusion layer 2 (i.e., n type) are implanted from the first principal surface side of the semiconductor substrate 1 by the ion-implantation method, for example. The layer into which the ions have been implanted is activated by a heat treatment, and thus a high-concentration diffusion layer 2C is formed. The parts of the high-concentration diffusion layer 2 that are left so as to sandwich the high-concentration diffusion layer 2c become the source regions 2a and the drain regions 2b.

Figure 30A:
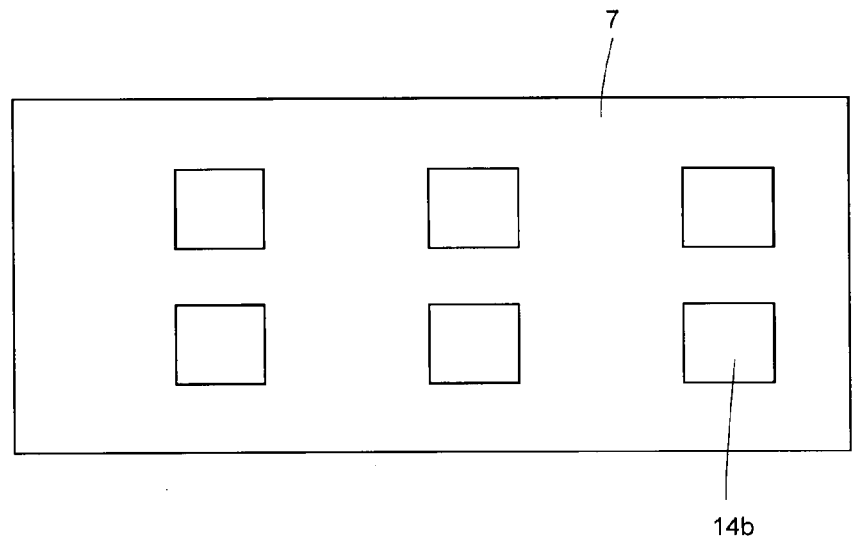
Figure 30B:
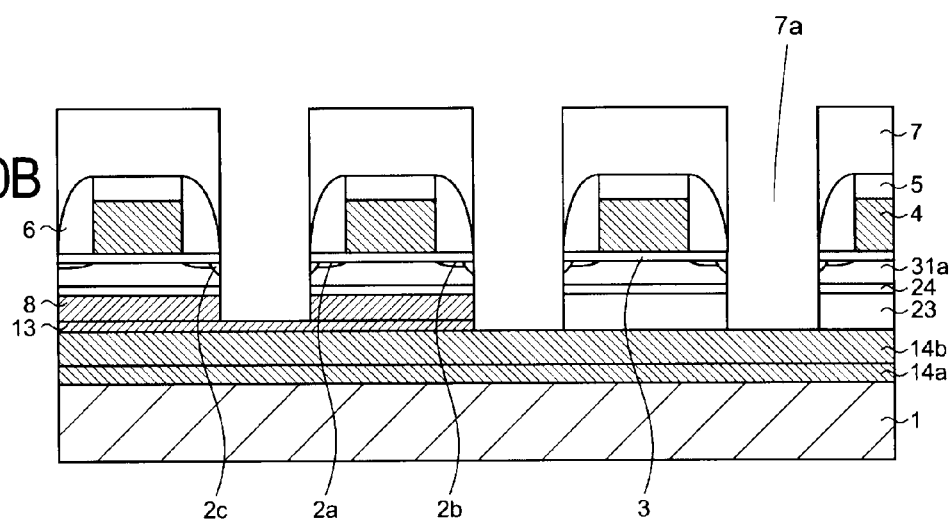

The insulation film 7 as an interlayer insulation film is deposited on the entire surface. Then, the insulation film 7 is polished in a flat surface by the CMP method, for example. Using a mask made by a known lithography method, some parts of the insulation films 5 to 7, of the gate insulation film 3, of the semiconductor film 31a, of the insulation film 24, of the phase change film 8, and of the insulation film 23 are removed by etching in accordance with the RIE method, for example. Thus, the first contact opening portions 7a are formed. The resist film is removed. As a result of the formation of the first contact opening portions 7a, the plural portions 8a are formed from the phase change film 8 as shown in FIGS. 30A and 30B.

These portions 8a may be separated from each other thoroughly or connected partly to each other.

Figure 31A:
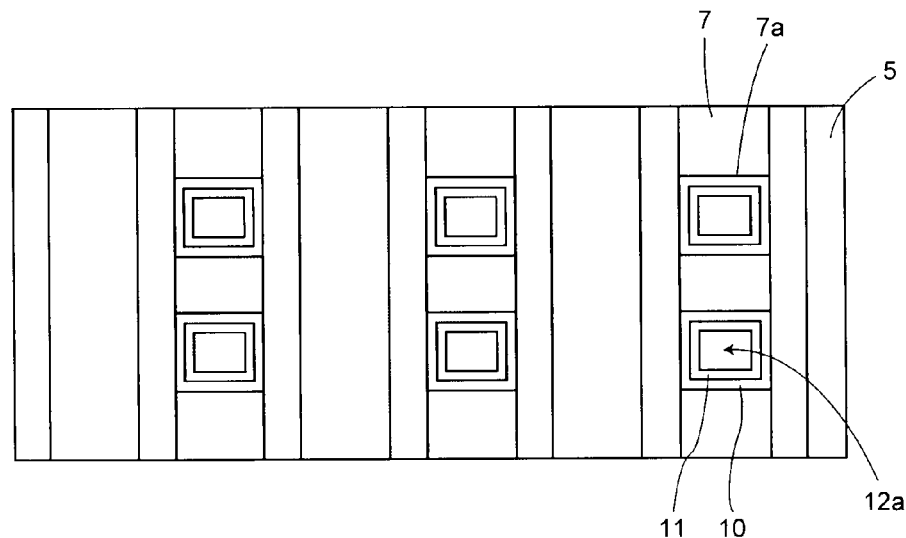
Figure 31B:
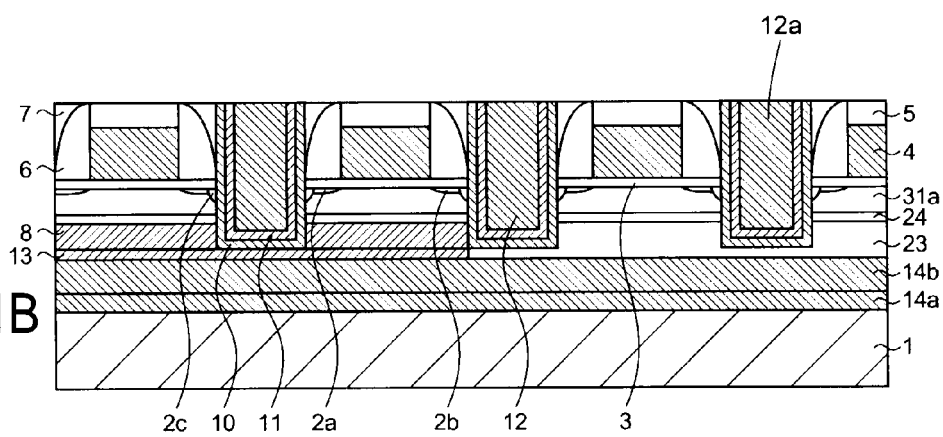

Layers of the metal film 10, of the metal nitride film 11, and of the via electrode 12 are deposited on the entire surface in this sequence. Then, the via electrode 12, the metal nitride film 11, and the metal film 10 are polished by the CMP method, for example, until the surface of the insulation film 5 is exposed. Thus the via 12a is formed in each of the first contact opening portions 7a as shown in FIGS. 31A and 31B.

Figure 32A:
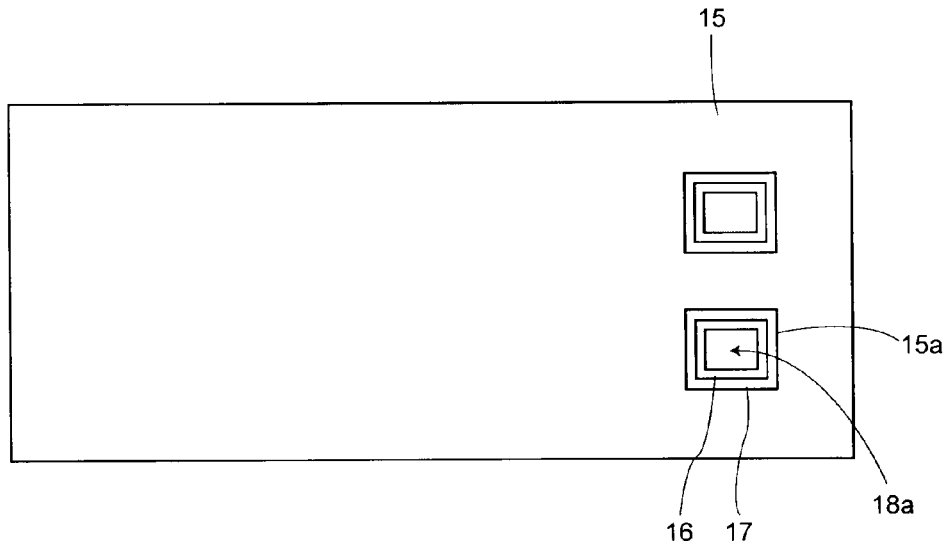
Figure 32B:
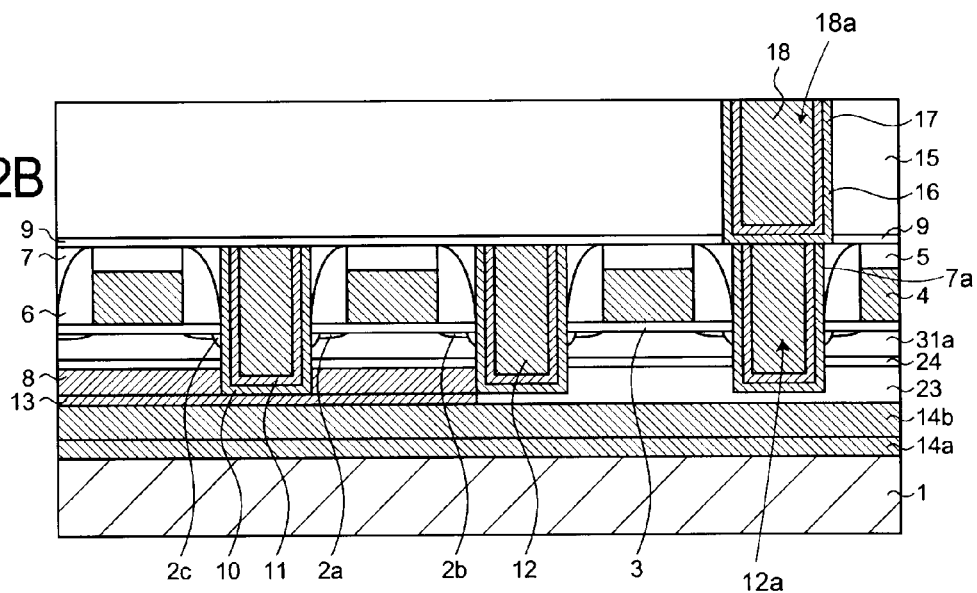

On the entire surface, interlayer insulation films 9 and 15 are deposited in this sequence. A part of the insulation films 9 and 15 is removed by etching to form the second contact opening portion 15a. The part thus removed is over the first contact opening portion 7a in which the via 12a is buried and which is located between the selection transistors SG1 and SG2. Thus formed is the second contact opening portion 15a. Then, layers of the metal film 16, of the metal nitride film 17, and of the via electrode 18 are deposited in this sequence on the entire surface. After that, the via electrode 18, the metal nitride film 17, and the metal film 16 are polished by the CMP method, for example, until the surface of the insulation film 15 is exposed. The via 18a shown in FIGS. 32A and 32B is formed in this way.

In addition, on the insulation film 15, a wiring layer 19 is formed as wirings of bit lines so as to come to contact with the via 18. After the formation of the wiring layer 19, interlayer insulation films and other wiring layers are formed by a known technique. Thus, the formation of the phase change memory device 40a is completed.

In the above-described method of manufacturing the phase change memory device 40a, the vias 12a to connect in series the memory transistors with one another and to connect each of the memory transistors in parallel to the corresponding one of the portions 8a of the phase change film 8 can be formed simultaneously with the vias 12a to connect the selection transistors. Accordingly, the phase change memory device 40a can be manufactured with a significantly smaller number of manufacturing processes.

In addition, the phase change film 8 is formed in a flat surface while the surfaces of the vias 12a and the surface of the insulation film 9 are formed in flat surfaces. In addition, the surface of the insulation film 15 and the surface of the via 18a are also formed in flat surfaces.

Accordingly, when the phase change memory device 40a is manufactured, the breaking of wiring becomes less likely to happen in the wiring layer 19 and in the wiring layers provided above the wiring layer 19. As a consequence, each of the wiring layers can be formed in a narrower width with ease while the multiple layer wiring can be achieved with ease.

Although the resistance change film 21 is formed above the memory transistors MT11a and MT11b in the second embodiment, there is a possible alternative arrangement in which the positions of the resistance change film 21 and of the memory transistors MT11a and MT11b are reversed. To be more specific, an SOI substrate is formed above the resistance change film 21, and the memory transistors are formed on the SOI substrate. In addition, although the memory transistors and the selection transistors are formed on the SOI substrate above the phase change film 8 in the third embodiment, the phase change film 8 may be formed above the SOI substrate on which the memory transistors MT11a and MT11b as well as the selection transistors SG1 and SG2 are formed.

The source regions 2a and the drain regions 2b in each of the embodiment described above can be used as the drain regions and the source regions, respectively, by changing the voltage applied to each of the regions and of the gate electrode.

Other embodiments of modifications of the present invention will be apparent to those skilled in the art from consideration of the specification and practice of the invention disclosed herein. It is intended that the specification and example embodiments be considered as exemplary only, with a true scope and spirit of the invention being indicated by the following.

What is claimed is:

1. A semiconductor memory device comprising:
a semiconductor substrate;
a memory cell array including a plurality of memory cells, the memory cells including a plurality of memory transistors and an alternative of phase change film portions and resistance change film portions, the phase change film portions and resistance change film portions being formed above the memory transistors to correspond to the memory transistors respectively, and each of the memory transistors including a gate insulation film formed on the semiconductor substrate, a gate electrode formed on the gate insulation film, a source region and a drain region formed apart from the source region in the semiconductor substrate;
a plurality of first vias, each of the first via being formed between two adjacent ones of the memory transistors and between two adjacent ones of the alternative of the phase change film portions and the resistance change film portions in order to connect the memory transistors to each other electrically and in order to connect the alternative of the phase change film portions and the resistance change film portions to each other electrically, and each of the first vias being electrically connected to the source region of one of the two adjacent memory transistors and to the drain region of the other of the two adjacent memory transistors,
wherein the memory transistors are connected in parallel respectively to the alternative of the phase change film portions and the resistance change film portions with the first vias, and the memory cells are connected in series to one another with the first vias;
a reaction prevention film formed on the phase change film; and
a heat buffer film formed on the reaction prevention film.

2. The semiconductor memory device according to claim 1, wherein the memory cell array further includes a plurality of selection transistors and second vias,
each of the selection transistors includes a gate insulation film formed on the semiconductor substrate, a gate electrode formed on the gate insulation film, a source region and a drain region formed apart from each other in the semiconductor substrate, and
each of the second vias is formed between two adjacent ones of the selection transistors, and is electrically connected to an alternative of the source regions and the drain regions of the two adjacent selection transistors.

3. The semiconductor memory device according to claim 2, wherein the memory cell array further includes third vias,
    each of the third vias is formed between one of the memory transistors and the adjacent one of the selection transistors,
    each of the third vias is connected to one of the source region and the drain region of each of the selection transistors electrically, and
    each of the third via is connected to one of the drain region and the source region of each of the memory transistors electrically.

4. The semiconductor memory device according to claim 1, wherein wirings of bit lines are formed above the alternative of the phase change film portions and the resistance change film with an insulation film interposed in between.

5. The semiconductor memory device according to claim 1,
    wherein an insulation film is formed between two adjacent ones of the memory transistors,
    a contact opening portion is formed in the insulation film, and
    each of the first vias is buried in the contact opening portion.

6. The semiconductor memory device according to claim 1, wherein an insulation film is formed between the memory transistors and the alternative of the phase change film portions and the resistance change film with an insulation film.

7. A semiconductor memory device comprising:
    a semiconductor substrate;
    an alternative of phase change film portions and a resistance change film portions formed above the semiconductor substrate;
    a semiconductor film formed above the alternative of phase change film portions and a resistance change film portions;
    memory transistors each of which includes a source region, a drain region, a gate insulation film, and a gate electrode, the source region and the drain region being formed in the semiconductor film so as to be apart from each other, the gate insulation film being formed on the semiconductor film, the gate electrode being formed on the gate insulation film, and the memory transistors being formed so as to correspond to the respective ones of the alternative of phase change film portions and a resistance change film portions; and
    a plurality of first vias, each of the first vias being formed between two adjacent ones of the memory transistors and between two adjacent ones of the alternative of phase change film portions and a resistance change film portions in order to connect the memory transistors to each other electrically and in order to connect the alternative of the phase change film portions and the resistance change film portions to each other electrically;
    wherein the memory transistors are connected in parallel respectively to the alternative of the phase change film portions and the resistance change film portions with the first vias, and the memory cells are connected in series to one another with the first vias.

8. The semiconductor memory device according to claim 7 wherein the memory cell array further includes a plurality of selection transistors and second vias,
    each of the selection transistors includes a gate insulation film formed on the semiconductor substrate, a gate electrode formed on the gate insulation film, a source region and a drain region formed apart from each other in the semiconductor substrate, and
    each of the second vias is formed between two adjacent ones of the selection transistors, and is electrically connected to an alternative of the source regions and the drain regions of the two adjacent selection transistors.

9. The semiconductor memory device according to claim 8, wherein the memory cell array further includes third vias,
    each of the third vias is formed between one of the memory transistors and the adjacent one of the selection transistors,
    each of the third vias is connected to one of the source region and the drain region of each of the selection transistors electrically, and
    each of the third via is connected to one of the drain.

10. The semiconductor memory device according to claim 7 wherein wirings of bit lines are formed above the memory transistors and the selection transistors with an insulation film interposed in between.

11. The semiconductor memory device according to claim 7, further comprising:
    a heat buffer film formed above the semiconductor substrate; and
    a reaction prevention film formed between the heat buffer film and the alternative of the phase change film portions and the resistance change film portions.

12. The semiconductor memory device according to claim 7,
    wherein an insulation film is formed between two ones of the memory transistors adjacent to each other,
    a contact opening portion is formed in the insulation films, and
    each of the first vias is buried in the contact opening portions.

13. The semiconductor memory device according to claim 7, wherein an insulation film is formed between the memory transistors and the alternative of the phase change film portions and the resistance change film portions.

* * * * *